US006747461B2

(12) United States Patent
Corak et al.

(10) Patent No.: US 6,747,461 B2
(45) Date of Patent: Jun. 8, 2004

(54) APPARATUS AND METHOD FOR MONITORING DRYING OF AN AGRICULTURAL POROUS MEDIUM SUCH AS GRAIN OR SEED

(75) Inventors: Steven J. Corak, Johnston, IA (US); James L. Hunter, Ankeny, IA (US); Whitney Skaling, Buellton, CA (US)

(73) Assignee: Pioneer Hi-Bred International, Inc., Des Moines, IA (US)

( * ) Notice: Subject to any disclaimer, the term of this patent is extended or adjusted under 35 U.S.C. 154(b) by 54 days.

(21) Appl. No.: 10/004,066

(22) Filed: Oct. 25, 2001

(65) Prior Publication Data

US 2003/0079365 A1 May 1, 2003

(51) Int. Cl.[7] ......................... G01R 27/32; G01N 25/56
(52) U.S. Cl. ......................................... 324/643; 73/73
(58) Field of Search .............................. 324/643; 73/73

(56) References Cited

U.S. PATENT DOCUMENTS

| | | | | |
|---|---|---|---|---|
| 3,079,552 | A | 2/1963 | Walker | 324/632 |
| 3,255,408 | A | 6/1966 | Walker | 324/632 |
| 3,644,826 | A | 2/1972 | Cornetet, Jr. | 324/637 |
| 4,135,397 | A | 1/1979 | Krake | 73/240 R |
| 4,239,010 | A | 12/1980 | Amburn | 342/70 |
| 4,326,163 | A | 4/1982 | Brooke | 324/640 |
| 4,825,146 | A | 4/1989 | Kotyk et al. | 324/642 |
| 5,218,309 | A | 6/1993 | Nelson et al. | 324/664 |
| 5,256,978 | A | 10/1993 | Rose | 324/601 |
| 5,376,888 | A | 12/1994 | Hook | 324/643 |
| 5,726,578 | A | 3/1998 | Hook | 324/643 |
| 5,893,218 | A | 4/1999 | Hunter | 34/492 |
| 6,085,443 | A | 7/2000 | Hunter | 34/535 |
| 6,230,419 | B1 | 5/2001 | Hinter | 34/381 |

OTHER PUBLICATIONS

S. R. Evett: Coaxial Multiplexor for Time Domain Reflectometry Measurement of Soil Water Content and Bulk Electrical Conductivity; Transactions of the ASAE, vol. 41(2); pp. 361–369.
W. Skaling; Trase: A Product History; Advances in Measurement of Soil Physical Properties, SSSA Special Pub. No. 30; Soil Science Society of America; ©1992; pp. 169–185 (odd # pages only).
Web page: http://www.soilmoisture.com/trase.htm; What is Time Domain Reflectometry?; printed from Internet Aug. 17, 1999 (3 pp.).
Web page; http://aceis.arg.ca/research/agtran/aagt–06e.html; Dr. G. Clarke Topp, Principal Investigator; Time Domain Reflectometry Measures Water Content in Feed Mixing & Drying Processes; Eastern Cereal and Oilseed Research Center, Ottawa, Ontario; printed from Internet Aug. 17, 1999; (1p.).
Dialog printout ©1994, #2368197 3333372; re: Kandala, et al; US 5,218,309; pp. 1–2.

(List continued on next page.)

*Primary Examiner*—N. Lo
*Assistant Examiner*—Donald M Lair
(74) *Attorney, Agent, or Firm*—Pioneer-Hi-Bred International, Inc.

(57) ABSTRACT

An apparatus and method for monitoring drying of an agricultural porous media such as grain and seed, includes deriving moisture content of the porous media using time domain reflectometry and utilizing moisture content to monitor and/or control the drying process. The porous media is positioned around a time domain reflectometry probe. An array of probes can be used to measure moisture in different areas of one batch of porous media or in a plurality of batches of porous media. The derivation of moisture content of the porous media around each probe would allow information to be provided to a dryer controller to alter the drying process if needed.

58 Claims, 17 Drawing Sheets

OTHER PUBLICATIONS

Dialog printout ©1994 citations from database search (7 pages).

Dialog citations ©1994 (1 p.); citing 3451782, 9401451, 3333372, 9306047, and 3311237.

The Next Generation of Moisture Measuring Equipment Trase Systems:, (4 pages).

Principles of Time Domain Reflectometry; Chp. 2, pp. 1–11.

Trase Operating Instructions, Soil Moisture Measurement ©1996 63 pages (double–sided).

Time Domain Reflectometry Theory; Hewlett Packard ©1988 (17 pages).

http://iti.acns.nwu.edu/clear/tdr/inw.html; Ian White, Steven J. Zegelin, G. Clarke Topp and Allison Fish; Effect of Bulk Electrical Conductivity on TDR Measurement of Water Content in Porous Media; printed from the Internet Aug. 17, 1999 (14 pages).

[Interface between probes and TDR device]

| | | | | Wave | guide | MUX | | | Zero | | | | |
|---|---|---|---|---|---|---|---|---|---|---|---|---|---|
| # | Tag | %M | Ka | Ft | Typ | Ch | G | Tab | T ns | Date | Time | P | Error |
| 1 | Abc | 22.0 | 3.70 | 8 | xxx | 7 | 0 | STD | 17.2 | 15-Apr | 15:30:27 | N | |
| 2 | Abc | 21.8 | 3.60 | 8 | Xxx | 7 | 0 | STD | 17.3 | 15-Apr | 16:00:27 | 1 | |
| 3 | Abc | 21.6 | 3.50 | 8 | Xxx | 7 | 0 | STD | 17.3 | 15-Apr | 16:30:27 | 1 | |
| 4 | Abc | 21.4 | 3.40 | 8 | Xxx | 7 | 0 | STD | 17.3 | 15-Apr | 17:00:27 | 1 | |
| 5 | Abc | | | 8 | xxx | 7 | 0 | STD | 17.3 | 15-Apr | 17:30:27 | 1 | |
| . . . | . . . | . . . | . . . | . . . | . . . | . . . | . . . | . . . | . . . | . . . | . . . | . . . | . . . |
| 74 | Abc | 0.1 | 2.00 | 8 | xxx | 7 | 0 | STD | 17.2 | 17-Apr | 4:00:27 | N | |
| 75 | Abc | 0.1 | 2.00 | 8 | Xxx | 7 | 0 | STD | 17.3 | 17-Apr | 4:30:27 | 1 | |
| 76 | Abc | 0.1 | 2.00 | 8 | Xxx | 7 | 0 | STD | 17.3 | 17-Apr | 5:00:27 | 1 | |
| 77 | Abc | 0.0 | 2.00 | 8 | Xxx | 7 | 0 | STD | 17.3 | 17-Apr | 5:30:27 | 1 | |
| 78 | Abc | 0.0 | 2.00 | 8 | xxx | 7 | 0 | STD | 17.3 | 17-Apr | 6:30:27 | 1 | |
| . . . | . . . | . . . | . . . | . . . | . . . | . . . | . . . | . . . | . . . | . . . | . . . | . . . | . . . |
| 126 | Abc | 0.00 | 1.90 | 8 | Xxx | 7 | 0 | STD | 17.3 | 18-Apr | 6:00:27 | 1 | |
| 127 | Abc | 0.00 | 1.90 | 8 | Xxx | 7 | 0 | STD | 17.3 | 18-Apr | 6:30:28 | 1 | |
| 128 | Abc | 0.00 | 1.90 | 8 | Xxx | 7 | 0 | STD | 17.3 | 18-Apr | 7:00:28 | 1 | |
| 129 | Abc | 0.00 | 1.90 | 8 | Xxx | 7 | 0 | STD | 17.3 | 18-Apr | 7:30:27 | 1 | |
| 130 | Abc | 0.00 | 1.90 | 8 | Xxx | 7 | 0 | STD | 17.3 | 18-Apr | 8:00:28 | 1 | |

FIGURE 7

Moisture = ((4.3096)(Δt)) -29.974

$R^2 = 0.8847$

◆ = TDR Calibration Data 186
104
12
32D
32C
32B
32A
184D
34D
182D
184C
34C
182C
184B
34B
182B
184A
182A
34A
11B
103I
103H
103G
103F
103E
103D
103C
103B
103A
100
106
L
10
11E-11E
11D-11D
103

APPARATUS AND METHOD FOR MONITORING DRYING OF AN AGRICULTURAL POROUS MEDIUM SUCH AS GRAIN OR SEED

BACKGROUND OF THE INVENTION

1. Field of the Invention

The present invention relates to artificial drying processes, and in particular, to automatically monitoring the moisture content of the material being dried during the drying process.

2. Problems in the Art

Many types of materials must be artificially dried as part of their processing. Some of those materials are porous media. The term "porous media", as used herein, means any material that has the ability to retain water, including collections of individual pieces of material, whether or not themselves "porous media". By artificial drying, as used herein, it is meant human or machine adjustable application of thermal energy and/or airflow: not a natural application of heat and/or airflow.

A particular example is seed corn. It must be harvested, handled carefully, and usually artificially dried to remove a portion of water it retains. The artificial drying process must be controlled to maintain seed quality, as opposed to non-artificial drying in the natural field environment.

Sometimes this artificial drying is done after the seed has been separated from its carrier, the cob (shelled). Sometimes it is done while the seed corn is still on the cob. In the latter case, ear corn is normally artificially dried in a large bin. It is desirable that the artificial drying removes moisture from the corn down to a certain level at a certain rate. If moisture is removed too quickly, it could damage seed quality. If moisture is removed too slowly, it could also damage seed quality. This can be extremely important. For example, improperly dried seed may not germinate when planted. Thus, it is important to not only monitor drying temperature, but also drying rate and level of moisture in the seed.

One conventional way of such artificial drying of ear corn is to place a relatively large quantity of ear corn (e.g. several tens of bushels) in a relatively large bin (e.g. 125 to 10,000 cubic feet), and manually adjust airflow and temperature of air through the ear corn. Seed corn weighs roughly 85 lbs./ft.$^3$ so there would be thousands of pounds of seed corn in each bin of this size. Normally drying is done simultaneously in multiple such bins. Samples are manually removed periodically and tested for moisture content. Airflow and temperature can then be adjusted to maintain the desired rate of moisture removal. General discussions about the drying of seed corn can be found at: Production of Hybrid Seed Corn, pages 565–607, In: Corn and Corn Improvement 3$^{rd}$ Edition, Edited by G. F. Sprague and J. W. Dudley, Published by the American Society of Agronomy 1988; Physiology of Drying in Maize. J. S. Burris, Pages 1–7, Proceedings of the Seventeenth Annual Seed Technology Conference. Feb. 21, 1995.

Hybrid seed corn is usually artificially dried to allow it to be harvested prior to frost, before being damaged by insects, infected by fungal pathogens, or before the ear falls off the plant. Typically it will take 3 to 4 days for a bin of freshly harvested corn to dry from an initial moisture content of 36% down to a final moisture content of 12%. This rate is determined by the current moisture of seed within a dryer bin, its genotype, and the demand for dryer capacity.

The maximum rate at which seed may be safely dried is determined by the specific drying injury susceptibility of each genotype. If the dryer's operating conditions are too aggressive, such as too high of temperature or too much airflow, drying injury may occur. These conditions are potentially different for each genotype dried, with harvest moisture interacting with genetic susceptibility in determining ideal drying conditions. Below this maximum rate the seed may be dried at a wide range of possible rates. However, if the dryer's operating conditions (dryer temperature and airflow) are not properly selected, drying may take an unnecessarily long time, resulting in lost drying capacity and increased energy consumption.

Therefore, two goals are a better final product after artificial drying and more efficient drying. In the case of ear corn, to achieve good levels of efficiency, a relatively large bin is needed to artificially dry a batch of a relatively large amount of ear corn together over a relatively long period of time.

The problem with the above-described method of monitoring drying rate is that it is quite cumbersome. To check on moisture levels of the drying ear corn, samples are periodically manually removed from the dryer bin and known laboratory techniques used to derive moisture content of the corn sample. A worker must physically gain entrance to the drying chamber (e.g. through a door) and manually extract one or more sample ears. Some bins are large enough that the worker can substantially enter the bin and grab ears of corn. Others have doors or access openings big enough for the worker to reach into the corn. However, in most cases, the worker can only reach a few feet deep into the pile of corn (e.g. up to his/her elbow) and extract an ear or two. If the ear is grabbed from near the top of the pile, the top is many times the last part of the pile to dry (if heated air is supplied from the bottom). Therefore, ears extracted from the top may not accurately characterize moisture content of the majority of the pile. Thus, many times the worker extracts ears from several places in the pile (e.g. 8 to 10 ears). This greatly increases the manual work involved.

The worker must then remove some seed from each extracted ear (again usually manually). The removed seed must then be manually handled and loaded into a machine or device for analysis (usually by laboratory-type moisture measuring equipment). After the results are obtained (normally after a period of time and not in real time), they can then be used to evaluate the drying process and/or to control the drying process. Many times this means the worker must key the moisture data into a computer.

Not only is the above-described process time-consuming, cumbersome, and labor intensive (drying usually proceeds over several days with moisture measures taken several times each day), it is difficult, if not impossible, to remove actual samples from very deep in the bin. Therefore, it is difficult to really test how drying is proceeding throughout the bin. Moisture readings from ear corn taken from the top, bottom, or a side of the bin may not be accurate for other locations in the bin, such as the middle of the bin. Such readings may mislead and cause application of a moisture removal rate detrimental to the corn. Furthermore, this process is subject to operator errors and accuracy problems. These problems are amplified because typically 72 to 96 dryer bins are run simultaneously to artificially dry a plurality of batches of relatively large amounts of corn.

There have been attempts to automate the drying process. For example, see U.S. Pat. No. 5,893,218 to inventors Hunter, Precetti and Chicoine, incorporated by reference herein. That patent discloses a system that makes it easier to control airflow rate and temperature in such relatively large dryer bins. But it relies on known moisture measuring methods, such as described above.

Therefore, it would be very helpful to also have automated measurement of moisture content or monitoring of drying rate of the ear corn in essentially real-time during the drying process. This intelligence could be used to monitor artificial drying and/or be used by an automated artificial drying apparatus to control the drying process.

Attempts have been made to create devices to measure moisture in porous media, including shelled corn or ear corn. One such example is the use of a radioactive source (e.g. neutron probe). A major problem with such a detector is that it creates safety issues for workers. It also requires special licensing and administrative burdens that are not insubstantial.

Another attempt uses a capacitance probe. Its primary deficiency is that it can only measure moisture near the bottom of the bin.

Microwave instruments, on the order of 1'×1', have been used. However, they cannot be used for substantial-sized dryer bins such as are used with ear corn or other bulk products.

Many of the above-described methods can sense or derive moisture content from just a small volume of material (e.g. one to a few seed or ears of corn). Therefore, they are not conducive to monitoring large volumes, such as in the example of ear corn drying discussed above.

In part because of the lack of a satisfactory measurement apparatus or method, sometimes predictions are used for moisture content, however, such predictions can be very inaccurate.

A methodology called time domain reflectometry (TDR) has been utilized to test electrical cables for breaks or defects. A electromagnetic pulse is sent down a cable. The location of a discontinuity (e.g. break) in the cable can be derived. The break will cause the pulse to be reflected back to source. Because the speed of the pulse is known, by timing the pulse and its reflection from a known starting point, the distance from the starting point to the break can be calculated.

Time domain reflectometry has also been used to attempt to sense moisture levels in the soil. In the case of soil, a relatively small probe (e.g. 20 cm long, ⅛" diameter rod(s)) is inserted into the soil. A portable processor instructs the generation of an electromagnetic pulse. Reflections of the pulse from the probe ends are evaluated and moisture content of the soil around the probe is derived. A basic discussion of TDR can be found at White, I., Zegelin, S. J., Topp, G. C., and Fish, A, "Effect of Bulk Electrical Conductivity on TDR Measurement of Water Content in Porous Media", published in Symposium and Workshop on Time Domain Reflectometry in Environmental, Infrastructure, and Mining Applications, Northwestern University, Evanston, Ill., Sep. 17–19, 1994 (Washington, D.C.: U.S. Bureau of Mines, 1994), pp. 294–308, USBM special publication SP 19-94, which is incorporated by reference herein.

Further reference can be taken to Soilmoisture Equipment Corporation Operating Instructions for Model 6050X1 Trase System I, available from Soilmoisture Equipment Corp., 801 S. Kellogg Ave., Goleta, Calif. 93117, also incorporated by reference herein. Principles and techniques of operation for use of Model 6050X1 for TDR measurement of moisture in soil is set forth.

TDR is based on the fact that propagation velocity of an electromagnetic wave along a transmission line (or waveguide) embedded in a material can be determined from the time response of a system to an electromagnetic pulse that becomes the wave, coupled with the fact that propagation velocity is a function of the bulk dielectric constant of the material in which the waveguide carrying the wave is embedded. Generally, the dielectric of a material is the ratio squared of propagation velocity in a vacuum relative to that in the material. If the bulk dielectric of the material, as it is with soil, is essentially governed by the dielectric of liquid water contained in the material, TDR is relatively insensitive to the composition of the non-liquid water components of the material. Such also is the case with seed corn and ear corn (e.g. bulk dielectric for unbound water is approximately 80; for corn approximately 1, whether ear corn or seed corn).

Essential to an understanding of the use of TDR to measure moisture of a material is the fact that although the electromagnetic pulse is sent through a transmission line such as an electrically conductive probe inserted in the material, its time of travel is affected primarily by the material around the probe, if there is substantial water content in the material. As surface waves (TEM or transverse electromagnetic waves) propagate along the probe inserted in the material being measured, the signal envelope is attenuated in proportion to the electrical conductivity along the travel path. This electrical conductivity is affected by the dielectric constant of the material around the probe. Thus, there is a proportional reduction in signal velocity. By measuring signal velocity, dielectric constant of the material can be calculated and by calibration with measurements taken from material of known moisture content, a calibration curve or relationship can be created to derive percent moisture content, because of the known relationship between dielectric constant and percent moisture content. See, e.g., Evett, S. R., "Coaxial Multiplexer for Time Domain Reflectometry Measurement of Soil Water Content and Bulk Electrical Conductivity" Transactions of the American Society of Agricultural Engineers (ASAE), Vol. 41(2):361–369, incorporated by reference herein. See also, Irrigation of Agricultural Crops, Number 30 in the series AGRONOMY, Published by the American Society of Agronomy 1990; and Time-domain Reflectometry for Measuring Water Content of Organic Growing Media in Containers. Tomaz Anisko, D. Scott NeSmith, and Orville M. Lindstrom. HortScience 29(12):1511–1513.1994, both incorporated by reference herein.

U.S. Pat. No. 5,376,888 to Hook, incorporated by reference herein, discloses a TDR system with probes insertable into material undergoing test for water or other liquid content, including granular and/or particulate materials other than soil, sand, or the like, giving grain and alcohol as examples, and is incorporated by reference herein in its entirety, including its discussion of the operation of TDR. However, Hook's methodology is not what is normally done in TDR waveform analysis. Hook's methods lose significant waveform information by the shorting methods disclosed. Hook therefore explains the principle of TDR in that context. A stepped pulse is generated and sent down the waveguide or probe. The reflection is analyzed to derive velocity of propagation of the wave by timing the wave through the probe and back. From the velocity of propagation, dielectric constant Ka can be derived. From Ka, volumetric water content can be derived. U.S. Pat. No. 5,376,888 is primarily concerned with making the beginning and end of the waveguide probe more clearly discriminated in the signal for increased accuracy of timing measurement points. It discloses 0.125" diameter stainless steel rods for the waveguide, similar to the size and configuration of TDR soil sample waveguides. Thus, such an apparatus can be used to quickly and easily measure moisture by inserting a small probe into the soil.

Hook's purposeful "shorting" is believed to be intended to produce a very distinctive end point reflection that did not need much interpretation or tangent fitting to derive an endpoint. The waveform is not like that created and observed in a step pulse (non-shorted) TDR system, such as the preferred embodiment of the present invention, and described in such literature as the previously mentioned Topp article and by others relative to determination of endpoint reflections used in TDR for determination of moisture content in a complex porous material such as soil, seeds or similar material. Hook's methods are particular to the instruments built by Hook and are not the accepted normal method of accurately determining water content by TDR methods. A shorted signal, such as in Hook, produces a flat line until the end reflection thereby eliminating important impedance information in the waveform as the electromagnetic pulse travels the waveguides. The impedance levels provide information as to the consistency of the material being measured along the path of the pulse. The delta t travel time (from beginning to end along a probe(s)) provides the average speed of propagation and therefore moisture content can be derived. The impedance along that traveled probe path changes along the path and provides some indication of the material's uniformity along the path of the probe. This can be very helpful in managing the drying of substances such as corn using long probes where one would like to know uniformity and deviations.

However, no time domain reflectometry (TDR) system is known which has been applied either to measuring moisture in porous media such as a batch of agricultural product such as ear corn for the purpose of monitoring moisture level or drying rate of a porous media during an artificial drying process.

There is a need in the art for an apparatus and method of autonomously monitoring of drying of agricultural porous media such as grain or seed that does not have the danger and licensing requirements of radioactive sources, allows essentially real time measurements, is non-destructive, allows use of a probe or probes sized for and operable in relatively large dryer bins, and is relatively inexpensive and durable. The need in the art includes the need for automatic non-destructive measurements that are sufficiently accurate for monitoring the drying process from a relevant location or locations in the material being artificially dried in the relatively large bins. The need also includes minimum interference with normal drying of the material. For example, there optimally would be a minimum decrease in the volume of drying space available, a minimum disruption of or interference with the flow of drying air and/or heat into, through, and out of the material; and minimum influence on the natural packing of material in the drying chamber. The need also includes robustness and durability for each particular environment and material; in one example, the forces caused by thousands of pounds of ear corn when loaded into a dryer bin, dried there, and then removed. Also, it is preferable that the apparatus and method have minimum affect on contamination of a succeeding batch of material from a preceding batch. Ideally, the system should be substantially self-cleaning, so that material from one batch does not remain when that batch is unloaded by normal methods, and additional cleaning steps are not usually required. Furthermore, there is need to minimize physical access by a worker inside of a dryer bin. OSHA regulations are fairly strict on this point. It would be desirable to eliminate or reduce the need for a worker to enter or even reach into the bins.

Objects, Features, or Advantages of Some Embodiments of the Invention

It is therefore a principal object, feature, or advantage of the present invention to provide an apparatus and method for monitoring drying of a porous media that improves over the problems and deficiencies in the art.

Other objects, features or advantages of certain embodiments of the invention include an apparatus or method as above described that:

a. provides for improved drying control;
b. provides for good quality final product after drying;
c. provides for automated drying;
d. provides for essentially real time moisture monitoring, even for relatively large amounts of porous media;
e. optionally provides for moisture readings at a variety of locations throughout the porous media, including rapid sequential readings from various locations in the product to be dried;
f. is relatively inexpensive, economical, and efficient;
g. is durable and long lasting;
h. provides for more efficient use of drying equipment;
i. provides for good level of accuracy;
j. is non-destructive and does not require alteration of the material being dried;
k. bases monitoring on actual measures not predictions;
l. does not have unduly complex or difficult calibration requirements;
m. is not necessarily product-specific relative to the product being dried;
n. avoids safety hazards that exist with other methods;
o. provides a significant amount of flexibility regarding location, orientation, and use of the measurement apparatus and the information derived therefrom;
n. provides for good spatial and temporal resolution;
p. provides for continuous data gathering;
q. is substantially self-cleaning;
r. presents minimal interference with the drying process; and
s. presents minimal disruption of normal packing of material in the drying chamber.

These and other objects, features, or advantages of the present invention or embodiments thereof will become more apparent with reference to the accompanying specification and claims.

SUMMARY OF THE INVENTION

The present invention is an apparatus and method for monitoring drying of an agricultural porous media such as grain or seed. The method according to the invention includes deriving moisture content using time domain reflectometry and utilizing the derived moisture content to monitor drying of the porous media. An optional feature of the method is deriving moisture content at a variety of locations throughout the porous media and utilizing those readings to monitor drying of the porous media. A further possible feature of the method is to utilize derived moisture content to control an artificial drying process.

The apparatus according to the invention includes a drying chamber for holding a porous media to be dried, a time domain reflectometry probe adapted for placement in a selected position in the drying chamber; and a time domain reflectometry device electrically connected to the probe and adapted to derive moisture content of the porous media. A possible feature of the apparatus is an array of probes positioned in different places in the drying chamber to collect moisture data at different locations in the porous media during drying. Another possible feature is to electrically connect the data output from the TDR device to another device, such as a computer and/or an automated artificial drying controller which controls the drying process for the drying chamber. Furthermore, one or more TDR probes could be placed in a plurality of drying chambers for moisture monitoring and/or control in each chamber.

BRIEF DESCRIPTION OF THE DRAWINGS

FIG. 7 is an exemplary output file of a TDR instrument.

DETAILED DESCRIPTION OF THE PREFERRED EMBODIMENT

A. Overview

For a better understanding of the invention, a preferred embodiment will now be described in detail. Frequent reference will be taken to the drawings. Reference numbers will be used to indicate the same parts or locations throughout the drawings unless otherwise indicated.

The embodiment described below relates to an artificial drying system for drying ear corn. The ear corn is the porous media. It is to be understood, however, that the invention is not limited to this embodiment or to this porous media.

B. General Apparatus

Figure 1:
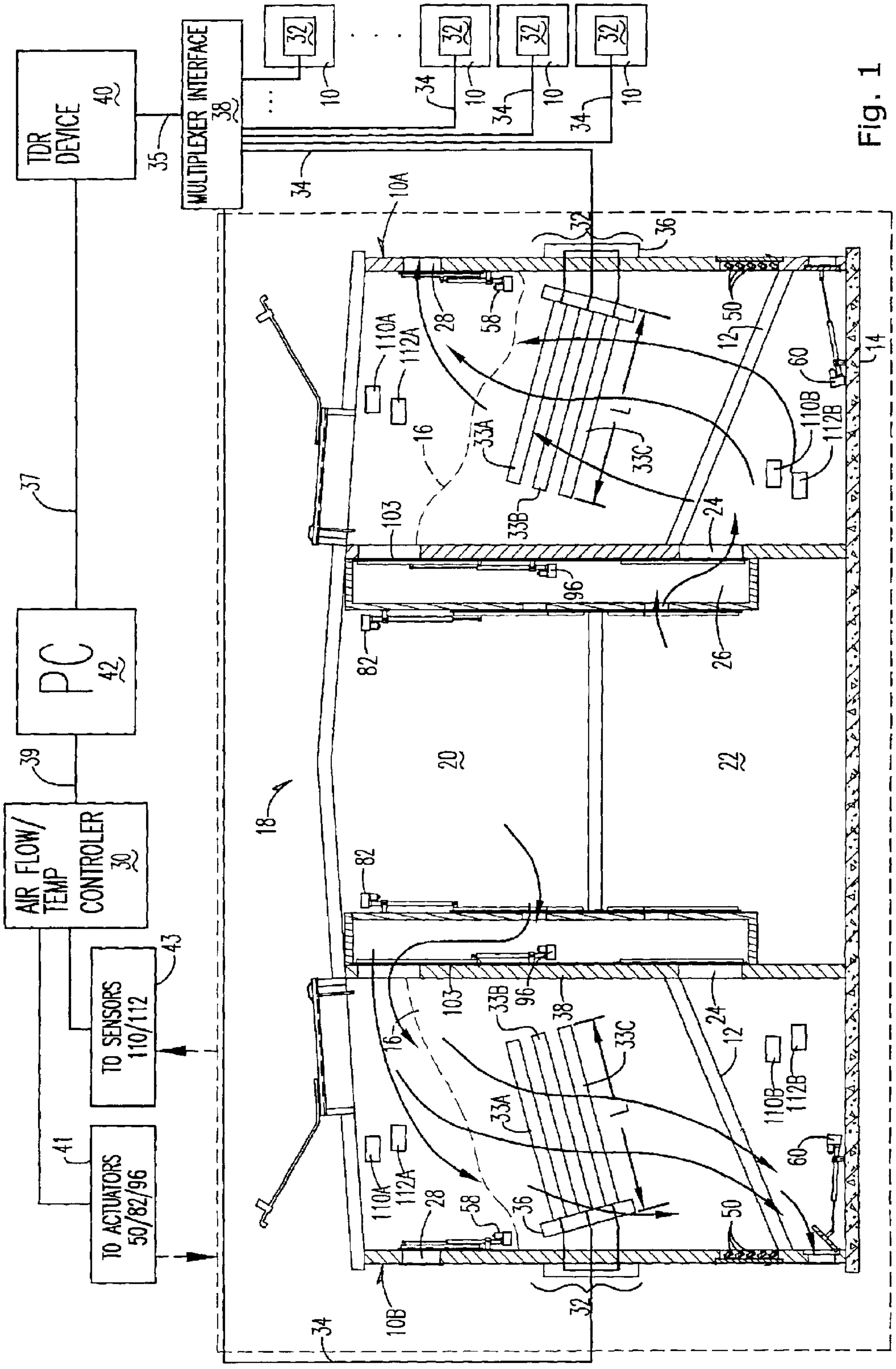
FIG. 1 is a partial sectional elevation and partial diagrammatic view of an embodiment according to the invention.

FIG. 1 illustrates diagrammatically an automated artificial drying system for ear corn. A dryer bin 10A is essentially enclosed with air impermeable walls except as discussed further below. An air permeable grate 12 is positioned above floor 14 of bin 10A and supports a pile of ear corn 16 inside bin 10A (line 16 indicates the top surface of ear corn in bin 10A; for simplicity, individual ears of corn are not shown). Maximum filling depth here is dictated by upper air intake door 28, which can not be blocked). A plenum 18 having hot and cold sub-plenums 20 and 22, supplies pressurized air at controlled temperature to bin 10A through opening 24 in bin 10A. As indicated by arrow 26, airflow through opening 24 distributes along and underneath grate 12 and then passes through ear corn 16 to outlet 28 from bin 10A.

A mirror image bin 10B could optionally exist on the opposite side of plenum 18. Additionally, a plurality of bins could be positioned along one or both sides of a plenum 18, elongated along a longitudinal axis.

The drying system just described can be the drying system shown and described in U.S. Pat. No. 5,893,218 to inventors Hunter, Precetti, and Chicoine, issued Apr. 13, 1999, which is incorporated by reference herein. Such a system, with airflow temperature controller 30 and other elements according to the preferred embodiment of the invention, can precisely manage the amount of air and temperature of air through bin 10, to assist in precise control of the artificial drying process.

Figure 2A:
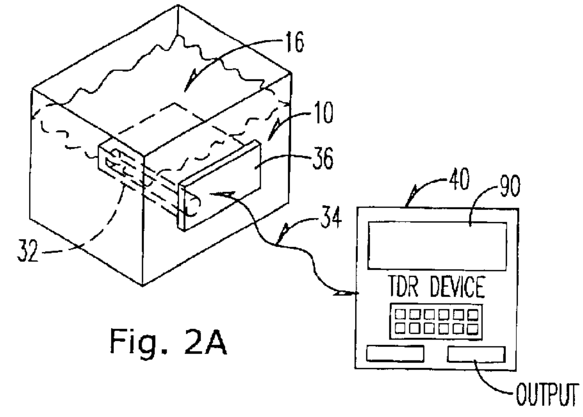
FIG. 2A is a diagrammatic view illustrating another possible embodiment according to the invention.
Figure 2D:
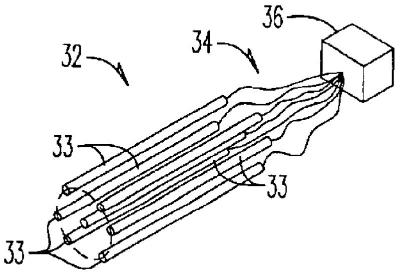
FIGS. 2B to 2H are further diagrammatic views of possible alternative embodiments to the one shown in FIG. 2A.
Figure 2E:
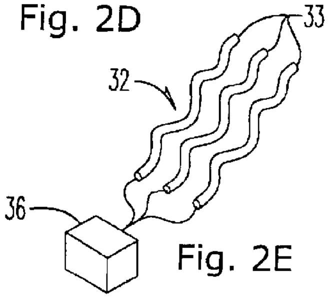
Figure 2B:
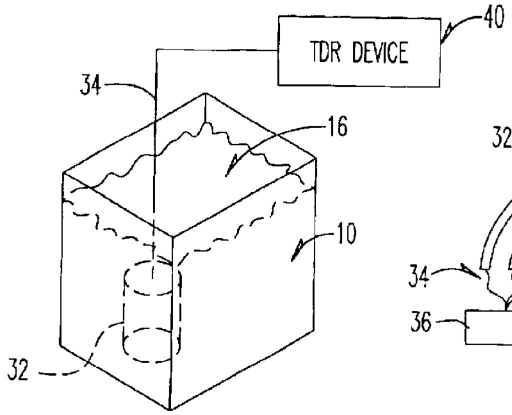
Figure 2F:
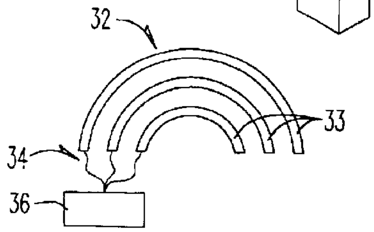
Figure 2G:
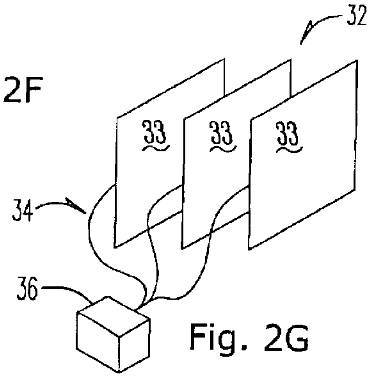
Figure 2C:
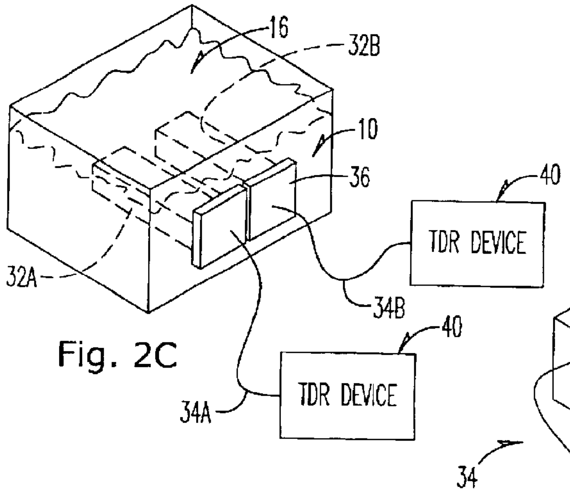

For purposes of illustration, FIGS. 2A–C show diagrammatically alternative embodiments of the invention. A TDR probe 32 (shown in FIGS. 2A–C generically) can be positioned to extend into dryer bin 10 by a header 36. Probe 32 is operatively connected to a TDR device 40 by cable 34. TDR device 40 is operated to send electromagnetic pulses through probe 32 and derive At for the pulses as affected by the product or material 16 in bin 10, and derive a percentage moisture for product 16 at or near the location of probe 32 in product 16. A display 90 on device 40 allows the monitoring of the drying process by taking periodic percent moisture measurements. Optionally, or in addition, data produced by device 40 can be output from device 40 to another device (see output from device 40). An example would be a PC or other type of controller or data logger. Apart from controlling an artificial drying process, FIG. 2A shows an embodiment where a drying process can be monitored.

FIGS. 2B and C are similar to FIG. 2A but illustrate that probe 32 can take different configurations and can be positioned in different locations or orientations within bin 10. FIG. 2C also illustrates that multiple probes 32 can be placed in the same bin 10 to measure moisture at different locations within the same drying product. The spacing, orientation, and configurations could differ. For example, the different locations could be at various heights or lateral positions. The plurality of probes could be parallel or not. The probes could be spaced evenly or not. The probes could be spaced apart horizontally, vertically, or otherwise. Additionally, it is possible to use one TDR device 40 for all probes, or as shown in FIG. 2C, a TDR for each probe. It is possible to generate the pulses for the probes in a device and then communicate the pulse to the probe. It is further possible to generate a pulse at or near the probe.

1. Probe

As shown in FIG. 1, the TDR probe of this embodiment comprises three electrically conductive members (here elongated members or tubes 33A–C) which extend substantially across bin 10 at different elevations of bin 10 (approximately 10" vertical separation between members 33A–C), but generally parallel to perforated floor 12 of bin 10. Probe 32 is supported in this position by structure (not shown in FIG. 1, but see FIGS. 11A–E). A probe had to be developed which could measure moisture at an area of interest in the product being dried. In particular, it had to be able to take measurements from a relevant portion of product being dried, and at a location within the product being dried to give an accurate indication of rate of moisture removal for the drying process. Furthermore, the beginning and end of the probe had to be accurately determinable relative to the signal sent out by TDR device 40. Additionally, the probe had to be rugged enough to stand up against substantial forces and conditions. For example, many thousands of pounds of ear corn might be poured into bin 10 onto, over and around a probe. Ear corn can shrink, shift, or slope during drying. This results in substantial forces on the probe. At the same time, the probe preferably results in minimum disruption of and minimum occupation of space relative to the normal operation of the bin and/or drying system.

In one embodiment, for a bin 10 the approximate size of 20' by 20' by 10', probe (generally referred to by reference number 32) comprises three members 33A–C each of which is a 8' long aluminum rod of 2" O.D. cross-sectional diameter, ¼" thick walls. Internally, each member 33 is substantially hollow (¼" wall thickness), see, as an example, FIGS. 11A–F.

Electrically conducting members 33A–C, each having a length L, are shown in FIG. 1. Members 33A–C function collectively as an electromagnetic wave guide. It was found that use of three members 33 was preferred because the electromagnetic field of the pulse from TDR device 40 is more contained. This is believed to provide more accurate readings. However, other probe designs are possible. The probe or the members of the probe are preferably aluminum because of the combination of light weight and electrical conductivity, but might be some other electrically conducting material, including ferro-magnetic.

Here probe 32 can be called a waveguide or TDR sensing element. It is a metallic transmission media where a broadband TDR pulse can travel along the skin, there being three such waveguide elements 33A–C; a center transmitting element (tube 33B) and grounding pair (tubes 33A and C) on either side of the transmitting element 33B. The pulse travels as a front between the center transmission tube 33B and outer grounds 33A and C through the material being measured.

Length of members 33 can be established by trial and error. With respect to relatively large dryer bins of the type of FIG. 1, members 33A–C are generally 4' to 16' long. Better results (e.g. better resolution for $\Delta t$) are usually obtained the longer the probe 32. However, the sizes of the dryer bin or container become physical constraints to probe length. Also, a consideration is the amount of energy needed to move the electromagnetic wave through the probe and the amount of attenuation of the signal. The longer the probe, and the wetter the material being measured, the more energy is needed to obtain a useable signal.

One compromise is between the increase in signal attenuation or energy loss the longer the probe and the decreased resolution (how small a change in measured time can be resolved) the shorter the probe. The issue is complicated by the fact that the lower the moisture content of a material, the lower the Ka (less impedance to the pulse). Therefore, as a material dries, its Ka changes, and correspondingly, the need for a longer probe increases for better resolution.

Probes greater than around 16' in length are not believed to be desirable for the environment and components of this embodiment, although they are not precluded by the invention. The drier the media being measured, the longer the probe length for better resolution. The length of at least member 33B is selected by considering at least the following considerations. One considers the amount of available energy in the fast rise voltage pulse to be sent through the probe. The length of cable 34 is considered (there is on the order of a 4 ohm per 100 ft attenuation of the signal). Also, as discussed above, the relationship between resolution and attenuation is balanced for a given material and environment.

Diameter of members 33A–C determine their spacing from one another.

Probe 32, here described as a "sensor array", is comprised of TDR sensing elements (waveguides 33A–C) assembled together. The probe 32 may be comprised of any number of sensing elements 33, as indicated FIGS. 2A–H, assembled in a manner that will provide adequate contact to the "porous material", while not impeding or preferentially distributing the porous materials being measured. The nature of the sensing elements used to create a probe will be determined by the size of the material being measured balanced against the attenuation of the TDR pulse that must traverse the probe 32. In the wettest conditions of the porous material encountered a reflective feature can still be determined from a TDR reflection feature. Size, shape and coatings can be used (on the waveguides—elements 33) to achieve the best possible array, thus fashioned into a probe configuration for a particular bin or silo. By extending the length of the sensing elements either by convolutions, spirals, or otherwise, one can increase the resolution of the measurement. The probe of FIG. 11 is therefore specific to the particular bins described herein. For other processors, bins and other porous material, the array configuration may well be different to achieve best results.

Thus, length of probe 32 and the diameter of individual elements 33 can be adapted for different bins or products or circumstances. This is the case also for spacing of probe elements 33. In general, it is believed preferable to have the spacing of the probe elements 33 in the porous material arranged for a 50 ohm impedance pathway when the materials are in the wettest conditions. Doing so will allow the most energy from the TDR pulser 40 to propagate without impedance mismatch losses thereby providing the highest reflection possible during the time of most attenuation. This spacing will be determined more by the materials scheduled to be measured, under their wettest condition to best determine a theoretical distance.

The drawings show the elements or members 33 parallel to each other and to the floor 12 of the bin. The floor plays no part in the equation as long as it is not influencing TDR pulses. When designing the system, the probe would be tested without material and brought to within a level where the metal floor was showing an affect on the probe. That would be the minimal distance that specific probe should be from metal. In general, the areas between the conductive and ground elements 33 of the sensor array within the probe 32 will have the most effect in TDR measurements. In general, sensing elements are kept parallel so that a uniform area of material is being measured. Keeping sensing elements in parallel simply makes the job of measurement interpolation easier. The probe does not have to be parallel with a metal floor. It can be at any angle desired to effectively measure the porous materials optimally. The key to probe placement is not causing a difference in bulk density of the materials being measured. Since one is measuring a load of product, it is important that the probe not interfere with natural settling and natural orientation of the material as it comes to rest and thereafter being measured. Probe design preferably should consistently maintain a standard bulk content within the sensor array elements. That way the probe is assured of measuring the materials under test and not differential bulk changes derived from wetness of the materials, loading practices, or drying settlement.

For ear corn, the spacing was influenced by the need to have ear corn naturally pack in bin 10. Members 33 in FIGS. 11A–F are roughly the cross-sectional diameter of an ear of corn.

Each member 33A–C is positioned inside bin 10 and connected to some type of header 36 or support. Header/support 36 is constructed of rigid material and is mountable in position in bin 10. Structural support for members 33A–C, as well as members 33A–C themselves, must be robust because of the forces experienced including loading, packing, and unloading of many bushels of ear corn around members 33A–C. The opposite ends of members 33A–C can be supported on rigid (e.g. steel) vertical supports (not shown in FIG. 1, but see FIGS. 11A–F) to form an array of members A–C in a strong frame. The frame in turn can be mounted to other support, for example, the walls or structure of bin 10, the floor of bin 10, and/or the top of bin 10. Additionally, if required, additional support can be used, such as steel cables or other assistance can be given to the array. See, e.g., FIG. 11A.

Here the bottom-most member 33 is spaced apart from the floor of bin 10 (preferably 12" or more). The floor is typically metal and could interfere with the measurements if a member 33 is too close. Also, the top-most member 33 should be sufficiently covered with the product being monitored (preferably at least 12" coverage) to get good readings. As previously mentioned, ear corn may shrink, shift or slope during drying. A member 33 should not be too close to the top or bottom margins of the ear corn mass or have any part exposed. As shown in FIG. 1, all members 33A–C are mounted generally parallel to floor 12 and generally parallel to each other.

Alternatively, other probe configurations are possible. More or less tubes or equivalent functioning structure are possible. For example, the probe array could have just two aluminum tubes, instead of three. See Hook U.S. Pat. No. 5,376,888, for example. However, this could increase the cost and complexity of the equipment and procedure for processing the TDR signals. Use of three members 33A–C, positioned sufficiently above the bottom of bin 10 and sufficiently under the top of the ear corn in bin 10, is believed to provide a good balance between obtaining moisture measurements from the interior of the ear corn in the dryer bin and avoiding significant interference with the amount of ear corn placeable into the bin, its drying, or its loading and unloading to and from bin 10. The probe array is shown in FIG. 1 with members 33A–C positioned generally in a vertical plane in bin 10. They could be positioned horizontally or in other orientations.

Figure 2H:
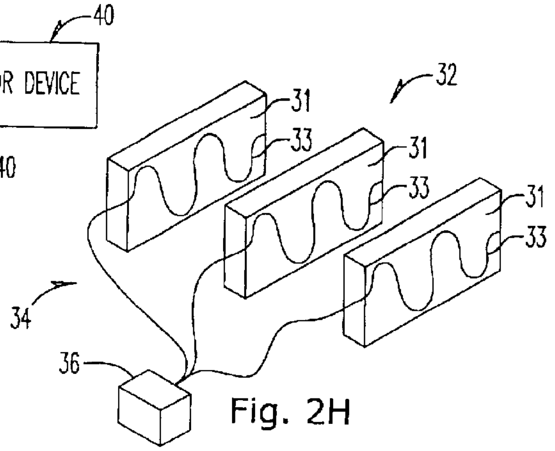

FIGS. 2A–G diagrammatically depict a few examples of alternative configurations of probe 32. FIGS. 2A–C are intended to illustrate the general concept that probe 32 could be positioned in the material being dried in various orientations (e.g. horizontal across bin 12, vertical in bin 12, or at other angles). FIG. 2D illustrates a center tube, rod or other conductor with multiple members radially surrounding the center member. FIGS. 2E and F illustrate non-linear, but generally parallel sets of elongated members. FIG. 2G shows generally parallel electrically conductive plates. FIG. 2H illustrates generally parallel electrically conductive wires. In this instance the wires are supported by clear acrylic plates. Other configurations are possible.

Another probe configuration alternative is shown at FIGS. 11A–F. Members 103 could be positioned throughout bin 10 for obtaining moisture readings from various locations in bin 10 (here the readings will be from different vertical strata in the material being dried in the same bin 10). Members 103A–I are operated in sets of three to create wave guides or probes 32A–D, each using three adjacent tubes or members 102. The "sets" are created by having a central tube 103 connected to conductor 182 (which is in electrical communication with the electromagnetic pulse source), and adjacent tubes 103 on opposite sides of the central tube 103 both connected to a conductor 184 (which are grounded). As shown in FIGS. 11A–F, this allows four probe sets 32A–D to be created with just nine probe members 103A–I.

2. Interface of Probe to TDR Device

Figure 3A:
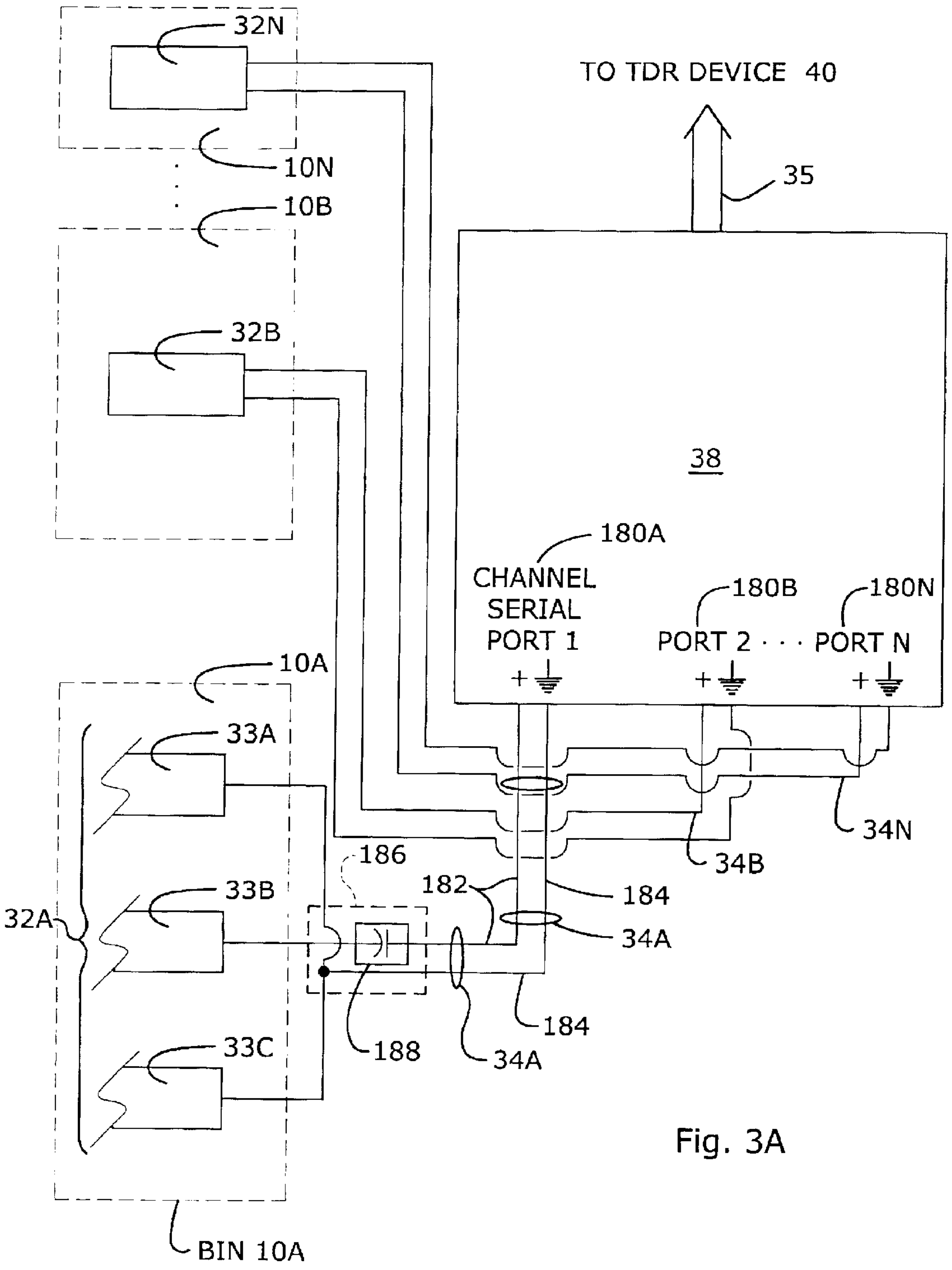
FIG. 3A is a schematic of electrical circuitry according to an embodiment of the invention.

FIGS. 3A and B show in more detail one way of connecting a probe such as shown in FIG. 1 with a TDR system such as illustrated in FIG. 1.

Probe array 32 is electrically connected to a multiplexer 38 by shielded low impedance coaxial cable 34. As illustrated in FIGS. 1 and 3A, a plurality of coaxial cables 34 can be connected to multiplexer 38 (e.g. 16 channel switching board), one cable 34 for each probe 32. For more channels, switching boards could be daisy-chained together.

As shown in FIGS. 1, 3A and B, 9, and 11F, coaxial cable 34 is connected at one end to serial port 180 of multiplexer 38. The opposite end of each cable 34 has a BNC connection 186 for connection to probe 32. In the case of probe 32A in FIGS. 3A and B, the middle conductor 182 of cable 34A is electrically connected to center waveguide 33B (see FIGS. 3A and B).

Member 33B serves as a transmission line and part of the waveguide for stepped electromagnetic TDR pulses (e.g. 50 Ohm broad-band pulses) generated by TDR device 40.

Figure 3B:
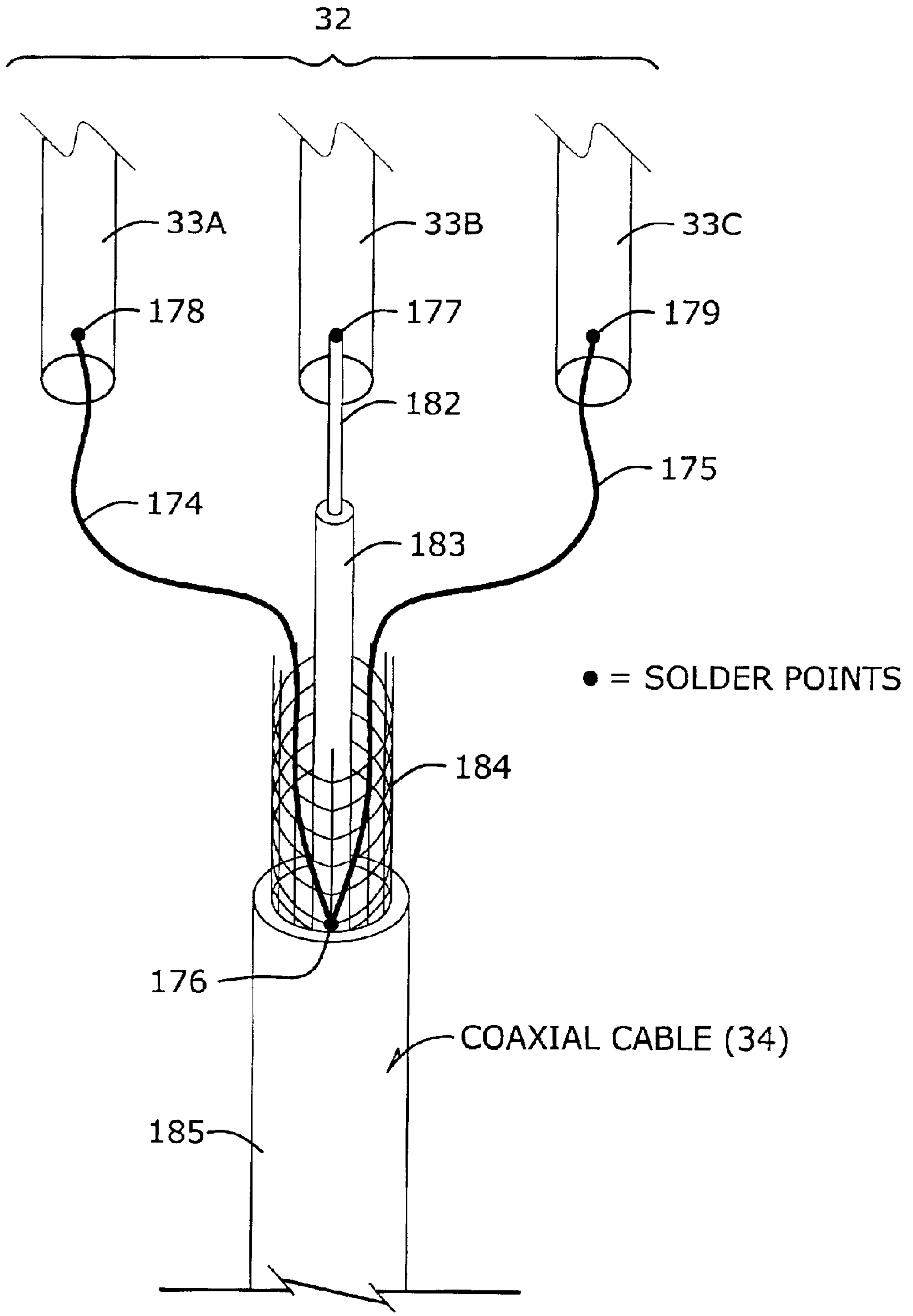
FIG. 3B is an isolated view of the connection between cable 34 and probe 32 of FIG. 3A.

The outer conductor 184 of cable 34A is electrically connected to both outer members 33A and 33C. As shown in FIG. 3B, coaxial cable 34 is conventional in construction, having a insulator surrounding inner conductor 182 and a shield 185 around the outer conductor web 184. Inner conductor 182 can be soldered in direct electrical communication with center tube 33B at solder point 177. Wires 74 and 75 can be soldered to outer conductor 184 at solder point 176 and at opposite ends to tubes 33A and C at solder points 178 and 179. A 10-picofarad capacitor 188 is placed in the electrical pathway of conductor 182 of cable 34 (see FIG. 3A). The purpose of the capacitor 188 is to introduce an electrical discontinuity which in turn produces a perturbation in the reflected signal that in turn can be used to better identify the start of probe 32 when TDR device 40 analyzes the reflected waveform from its initial pulse, as will be explained more later herein. Preferably, the size of capacitor 188 is selected to create an ideal impedance mismatch. A busbar, such as is known in the art, is used to connect the co-axial BNC or bayonet Nelson connector 186 to a probe 32 to distribute voltage across multiple circuits.

Multiplexer 38 can be a Model 6021.C16 sixteen channel multiplexer from Soilmoisture Equipment Corp. of Goleta, Calif. It has multiple ports 180A, 180B, . . . , 180N, corresponding to multiple channels. This allows multiple probe arrays to be handled by the system. As illustrated diagrammatically in FIGS. 1 and 3A, a probe array 32 could be placed in each of a plurality of dryer bins 10A, 10B, . . . , 10N. Cables 34A, 34B, . . . , 34N would connect each probe 32 in each bin 10 to multiplexer 38. Alternatively, or in addition, multiple arrays 32 could be placed in a single bin to get readings from different locations in one bin 10.

Thus, interface 38 is essentially a multiplexer which can coordinate signals from TDR device 40 to members 33A–C and reflections of those signals from members 33A–C, and process them according to TDR analysis to derive moisture content of the material around each probe array 32.

3. TDR Device

Multiplexer 38 is electrically connected to a TDR evaluator or device 40 via cable 35 (see FIG. 1). Device 40 is a Model BE time domain reflectometry device available from Soilmoisture Equipment Corp. of Goleta, Calif. Device 40 uses an SMT hybrid step pulser to produce high frequency (e.g. 3 GHz) voltage pulses on the order of 200 psec pulse rise time and sends these voltage pulses to multiplexer 38, which distributes them via coaxial cables 34 to the radiating elements of each parallel waveguide probe array 32 in a controlled sequence. Preferably, the pulses are generated as close to each probe 32 as possible to minimize loss, which can be on the order of −4 dB per 100'.

For the system of FIG. 1, device 40 is powered by 18–24 VDC or VAC (3 Amp) via an 8 pin DIN connection. Device 40 is connected to multiplexer 38 via 2 pins on a 15 pin d-subminiature connector port (15 dB). On board memory is 256 kilobytes (additional memory can be added).

Other similar devices could be used. For example a Soilmoisture Equipment Corp., Model 6050X2 TRACE™ device could also generate such a pulse and analyze the reflection. Such a device also includes an integrated 128×256 dot super twist backlit LCD display and has various user adjustable controls (including a keypad for input).

Velocity of the wave through probe 32 is primarily a function of water content of the ear corn. A portion of the energy of the pulses is reflected by an impedance mismatch (e.g. capacitor 188 or otherwise) intentionally created at or near the proximal end of the probe 32 and from the open ends of the wave guides 33 of probe 32, and these reflections return along the same path back. The returned waveform of each probe array 32 is then channeled back through multiplexer 38 to TDR device 40 for processing. The reflected voltage signal is rapidly sampled as a function of time. The TDR device 40 controls the sampling and switching rates with multiplexer 38.

Travel time of a pulse (Δt) is measured by device 40 and used to calculate the apparent dielectric constant (Ka) according to:

$$Ka=[\Delta tC/L]^2 \quad \text{(eq. 1)}$$

where Δt is the measured difference in time between the beginning and end of the waveguide (ns); C is the speed of light (30 cm/ns); L is the length of the waveguide (cm).

TDR device 40 measures the travel time of the fast rise pulse from the start (proximal end) of each probe 32 to its distal end by parsing the reflected waveform. The proximal end is discernable because of the use of capacitor 188 which creates a perturbation in the waveform. The distal end is discernable because it is open and also creates a perturbation in the reflected waveform. The time between those reflections is directly proportional to the actual time the pulse takes to traverse the probe.

The TRASE Operating Instructions, incorporated by reference herein, give explanation of the process. The pulse is created in the pulser unit of the Trase TDR instrument 40. Once the pulse encounters the 50 ohm cable connecting the pulser 40 to the outside world there is a large noticeable rise in impedance levels. The purposeful placement of an impedance mismatch (either inductive—up going or capacitive down going marker) describes the beginning of a waveguide (or sensing element).

The TDR pulse will vary in impedance levels dependent upon the dielectric nature of the simple or complex materials encountered along the waveguides. Upon reaching an end point, there is a significant rise in the impedance levels of the pulser signal as it ends propagation along a metal skin of a waveguide (sensing element). This significant waveguide end point feature of the TDR waveform is the "reflection" in the TDR nomenclature.

Trase makes some 8 passes in its measurement processes and any one sample point will represent the average of the 8 sampled levels at that location along the waveguide. In general, it has been found that the variance from each pass to be insignificant in determining the final average—since the electronic processes now used create very little variance in overall Trase operations. A waveform is created by sampling the voltage level along the waveguides 33 as the pulse progresses down those waveguides. Sampling can be done at 10 ps intervals to 80 ps intervals.

Much like a digitizing oscilloscope, software looks for waveguide or sensor features (initial up/down going features) or by command using a "time to window", either of which indicate when the sampling window will start. In that sampling window 1000 points are sampled in creating a very detailed TDR waveform. Sampling windows therefore are 10 ns, 20 ns and 40 ns in standard sampling formats. In the present case, where a special sampling window size is desired, this can be accomplished in the "Cable Tester" mode of the Trase unit using command set language. Sampling period will determine the x component of a TDR waveform and the y component is established by the voltage at a sampled point as determined by a 12 bit A/D converter with a possible 4096 increments for the voltage range of the unit.

The Trase BE is a non-LCD version of the Trase standard unit, but instead of having a "on the unit display" it uses a command set of instructions or Visual Basic WinTrase to command and control a remote Trase in the field.

Unless there is a marker at the beginning of the waveguide, most TDR waveform analysis uses tangent fitting for both beginning and the end point determinations. It is the travel time through the waveguide or sensor that is of most importance. The Trase BE unit does all tangent fittings required, then using the internal "calibration" "lookup table" for the travel times developed in that waveguide or sensor type it will produce a moisture reading. If Trase is connected to a PC or other RS-232 compatible device it will return either upon completion or as a batch process the moisture reading alone, or moisture reading and the 1000 sampled points of the TDR waveform in their x,y values. In batched mode all readings or readings and waveforms can be transmitted.

The broadband pulse created in a Trase or other step pulse TDR systems will, as it passes through cable and waveguides to an endpoint, create a TDR waveform. TDR waveforms will in general have similar features which will include an "Incident" feature (the point of pulse creation), a long and sustained impedance level that will indicate the "Cable" feature, a abrupt change in impedance levels indicating the "Beginning of Waveguide" (Sensor) feature, a down going or up going impedance level as the pulse travels the waveguide. Finally, the waveform ends in an abrupt rise in the impedance level as the pulse exits the metal waveguide, this feature is known as the Reflection feature. All the features are part of any sampled step TDR waveform.

Device 40 has 40 psec sampling resolution for its measured Δt's. An internal microprocessor converts this measured travel time to derive Ka. From Ka, % moisture content can be derived, e.g., by referring to a look-up table associated with the calibration curve selected for the product being measured.

The difference in drying rate and moisture % is as follows. The drying rate will be the expression of a line as it is formed by connecting the individual moisture % points (decreasing) over time. The drying rate will be a function (either linear or other) that best describes the line created by joining the moisture points over time. X is time; Y is the moisture % at that point in time. This line will differ dependent on the type or variety of materials being measured and the initial condition at the start of drying. In the present case, one normally would want to provide the highest rate of drying, while keeping the materials within sensitive temperature boundaries and using as little energy resources doing so.

Note that Ka can vary with temperature. This variance is accounted for in the process matrix within the computer program used for determining specific moisture levels.

4. PC

PC 42 is electrically connected to TDR evaluator 40 by connection 37 (asynchronous 25 dB RS-232-C serial port) and to airflow/temperature controller 30 by connection 39 (e.g. Ethernet). Software (e.g. RS View) and PC 42 can take the TDR calculations from device 40 and send instructions to controller 30 based on the monitoring of the moisture content of the ear corn 16 during the drying process. PC 42 can also log the TDR moisture readings for future use or reference. PC 42 can check on the moisture readings periodically relative to a desired rate of moisture removal for the product being dried. PC 42 then can issues instructions to airflow controller 30, which includes a microprocessor (not shown) that can communicate with PC 42.

For example, if moisture readings from TDR device 40 indicate that moisture is being removed too slowly from ear corn 16 in a bin 10, PC 42 can instruct controller 30 to increase air flow rate and/or temperature to speed up moisture removal. PC 42 would then check moisture level via TDR device 40 and adjust (or maintain) the drying rate based on that information. This would continue over the course of the drying process for that batch of ear corn.

5. Air Flow Controller

Controller 30 can be such as is disclosed in U.S. Pat. No. 5,893,218, incorporated by reference herein and can be connected to sensors 43 and actuators 41 via a device (e.g. Allen-Bradley programmable logic controller (PLC) Model 5/41C15).

Thus, as shown in the embodiment of FIG. 1, the apparatus comprises a probe array 32 in each bin 10 of a multiple bin dryer, and electrical connections 34 from each array 32 to multiplexer 38. Ear corn 16 is loaded into each bin 10 to cover each array 32. The apparatus then uses the automatically obtainable moisture measurements to monitor and/or control drying As for the airflow rates, and/or temperature, etc., these will be controlled in most part by a commercial available Programmable Logic Controller (PLC) mated to a PC, or directly from the PC. The PLC or PC will automatically adjust a number of factors within the drying bin to achieve optimum drying cycles for the porous materials being dried. By processes described in U.S. Pat. No. 5,893,218, the best arrangement damper settings, furnace settings, fan levels and direction of flow for minimum time in the drying cycle can be derived and implemented, included in a partially or fully automated manner.

C. Operational Principles

The basic principles of TDR are well-known and set forth in detail in the literature, including the citations set forth earlier herein. For further information regarding TDR, reference can be taken to U.S. Pat. No. 5,376,888, incorporated by reference in its entirety herein. The TDR pulses are slower in wetter product, and faster in drier product. The drier the product is, the greater the wave propagation velocity of the pulse and its attendant field.

It is a well known TDR principle that Δt is related to the dielectric properties of the substances that surround the probe. It has also been established that in most cases the amount of water or moisture in the media being measured is the largest influence on dielectric properties for the substance.

The time of travel of the pulse through the probe is related to the dielectric properties of the media around the probe, particularly moisture content. See Time Domain Reflectometry Theory, Application Note 1304-2, Hewlett Packard, copyright 1988.

This technology has been validated in testing for moisture levels in soil. Typically the probe is inserted a distance in the soil and has two parallel electrically conductive rods. The reflection from both rods is evaluated, Δt measured, and from that dielectric constant of the soil around the probes derived and then converted to moisture content. The system provides almost instantaneous soil moisture readings, is portable, durable, and economical. It does not have the worker or environmental safety problems of some other moisture measurement techniques and is non-destructive. It allows in situ measurements.

However, for ear corn and other similar porous media, the small soil moisture or U.S. Pat. No. 5,376,888 probes are not satisfactory for ear corn bins.

1. EXAMPLE 1

In an early test of concept, a minimum 1.5 volt step pulse function was created with a Trase device with a 90% rise within 150 picoseconds or less. This pulse was a constant function and does not vary once the Trase unit has passed functional testing. A waveguide set 33 or "probe" 32 was created with tubes 16 feet long with 4 foot spacing using a balanced waveguide technology (having a balun—high speed transformer). We inserted water filled balloons between the sensing pairs and found that the concept worked quite well. This preliminary concept trial test used a standard Trase and modified Waveguide Handle to send TDR pulses down tubes and measure effect of water balloons.

2. EXAMPLE 2

Figure 4A:
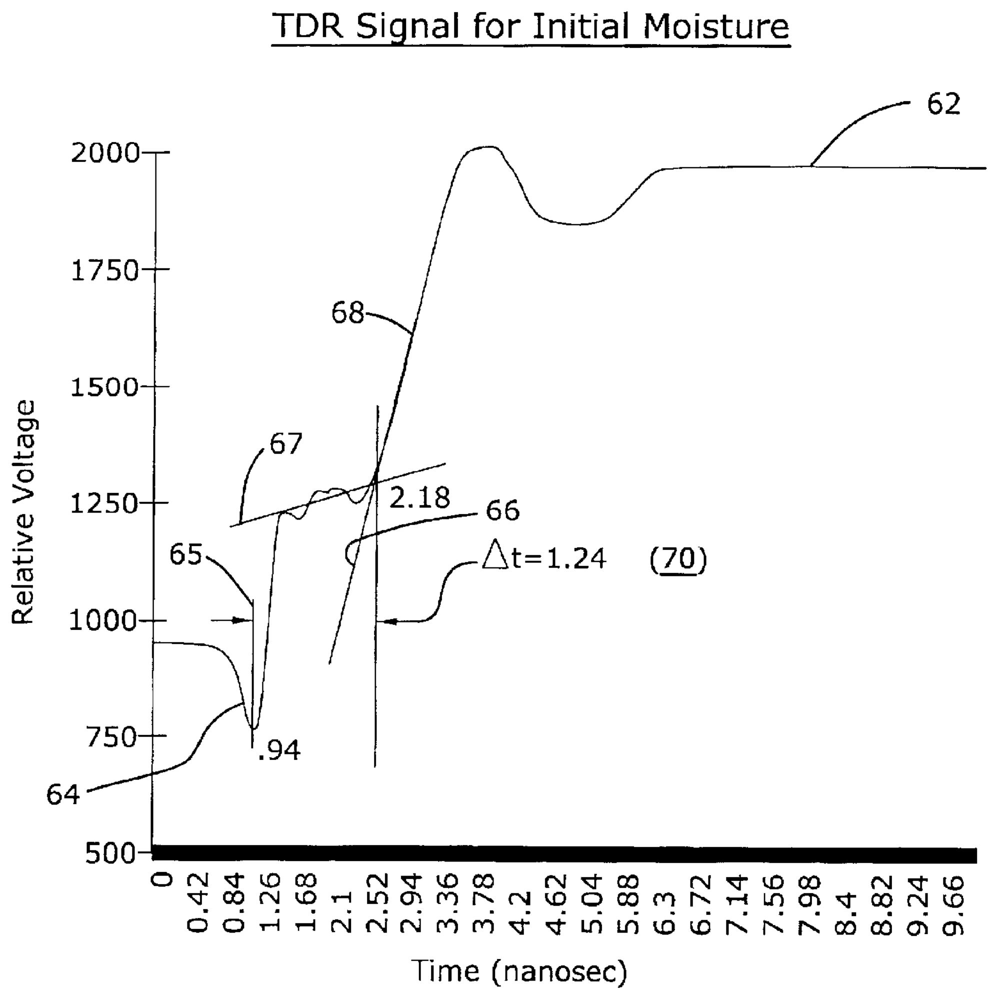
FIGS. 4A and 4B are graphs of a TDR signal derived from a TDR probe in a quantity of shelled corn illustrating a Δt measurement for shelled corn at an initial moisture content (FIG. 4A) and at a final moisture content (FIG. 4B) during drying of the shelled corn.

To validate use of TDR for measuring seed or grain moisture, an experiment was conducted using approximately 5,000 kernels of shelled corn in a 4 liter volume colander. FIGS. 4A and B illustrate two plots for a probe positioned in shelled corn, with a probe similar to shown in FIG. 1, but substantially smaller in size (20 cm long, each of three tubes ⅛" in diameter) and in a container substantially smaller than bin 10. The parameter Δt in FIG. 4A is measured at the beginning of a drying process and is related to the initial moisture content of the shelled corn. A pulse of predetermined magnitude was sent to member 33B. The pulse was a transverse electromagnetic wave (TEM) which propagated along members 33A–C. The signal energy was attenuated in proportion to the electrical conductivity along the travel path. The waveform in FIG. 4A is the sensed reflected signal 62 of time of travel of the pulse through waveguide probe 32. Reference number 64 indicates the start of probe 32, for example, by crimping cable 34 at the connection or placing capacitor 188 there (see FIG. 9), which introduces an intentional impedance mismatch into the waveform and thus in the reflection, a point that can be discriminated by its characteristics. Software is configured to look for the reflection over a window in time (see FIG. 6, reference number 72).

Within window 72, the first major disruption of the signal is the reflection from capacitor 188. A window is used to reduce processing overhead. It can be adjusted or selected. It eliminates possible sources for error, such as noise or spikes in the signal outside the window.

The lowest point of the portion of plot 62 of FIG. 4A at 64 (indicated by vertical line 65) is designated as the beginning of Δt. Once the pulse has entered probe 32, it is in a region of different dielectric value. FIG. 4A shows the reflected waveform in this region relatively consistently and smoothly increases. At and just before reference numeral 66, the reflected waveform changes to a different form before again (after point 66) increasing in a relatively consistent and smooth manner after point 64. The signal, at and around point 66, is indicative of the distal end of probe 32 (the intersection of lines 67 and 68, which are best-fit to the portions of plot 62 on either side of 66).

TDR device 30 is programmed to recognize point 64 as the starting time for Δt, and point 66 as the ending time for Δt. Reference numeral 70 shows Δt; the measured time between points 64 and 66, the time of travel of the pulse through probe 33B, as influenced by the dielectric properties of the material around it (here the shelled corn). By designating points 64 and 66, TDR device 40 can time and store Δt. The techniques for determining and designating the precise location along the waveform for points 64 and 66 are within the skill of those skilled in the art. Examples can be taken from other TDR applications, including the Soilmoisture Equipment Company Model BE TDR evaluator. In this example, measurements were taken at 15 minute intervals.

Figure 4B:
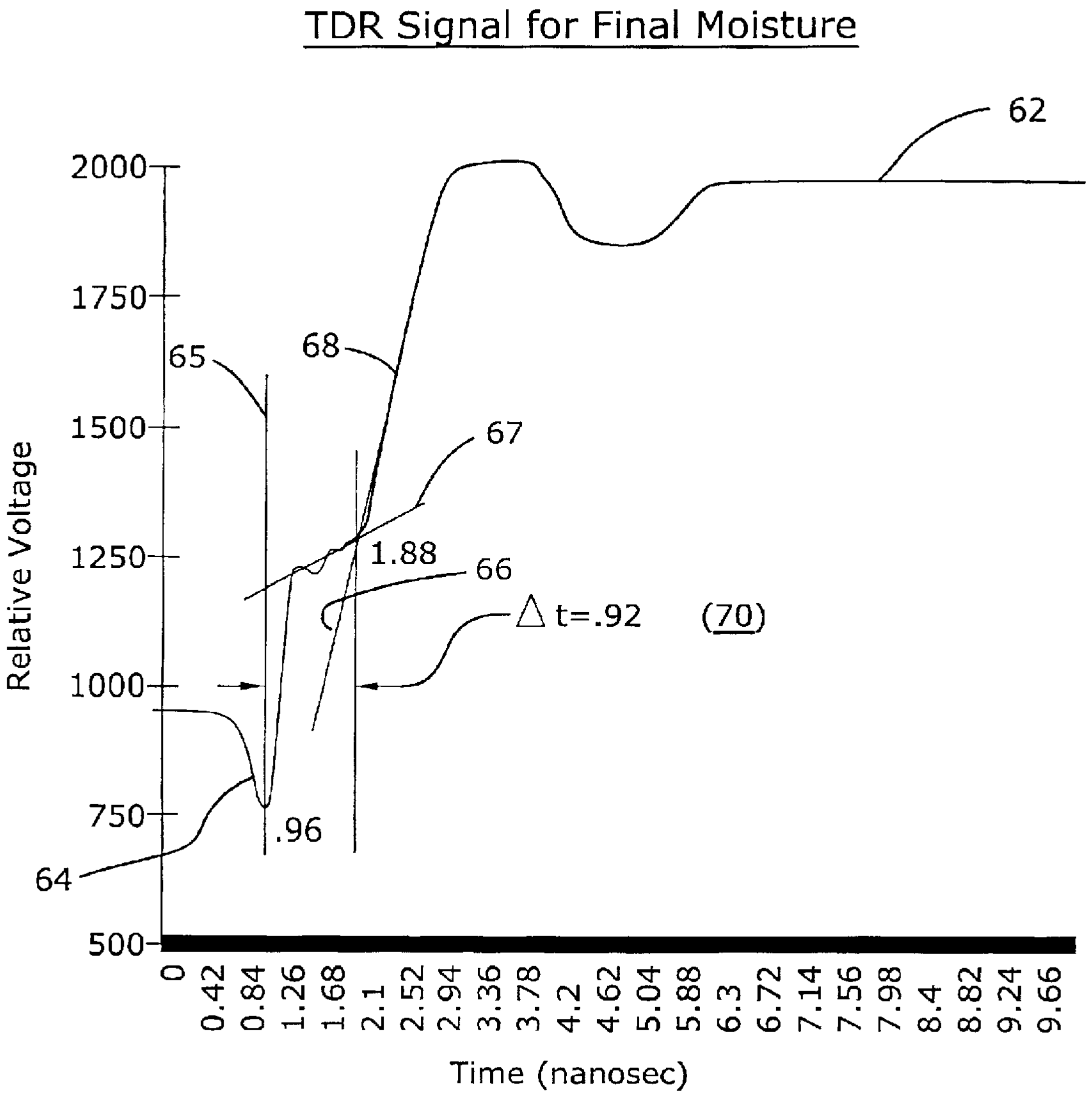

FIG. 4B is similar to FIG. 4A, but illustrates Δt when drying is being completed. Because of the known influence of Δt by the dielectric properties of the material around the probe, the TDR device can convert Δt to a dielectric constant. As can be seen, Δt has decreased, which indicates the validity of utilization of TDR for measuring moisture content in a porous media such as shelled corn.

Figure 5:
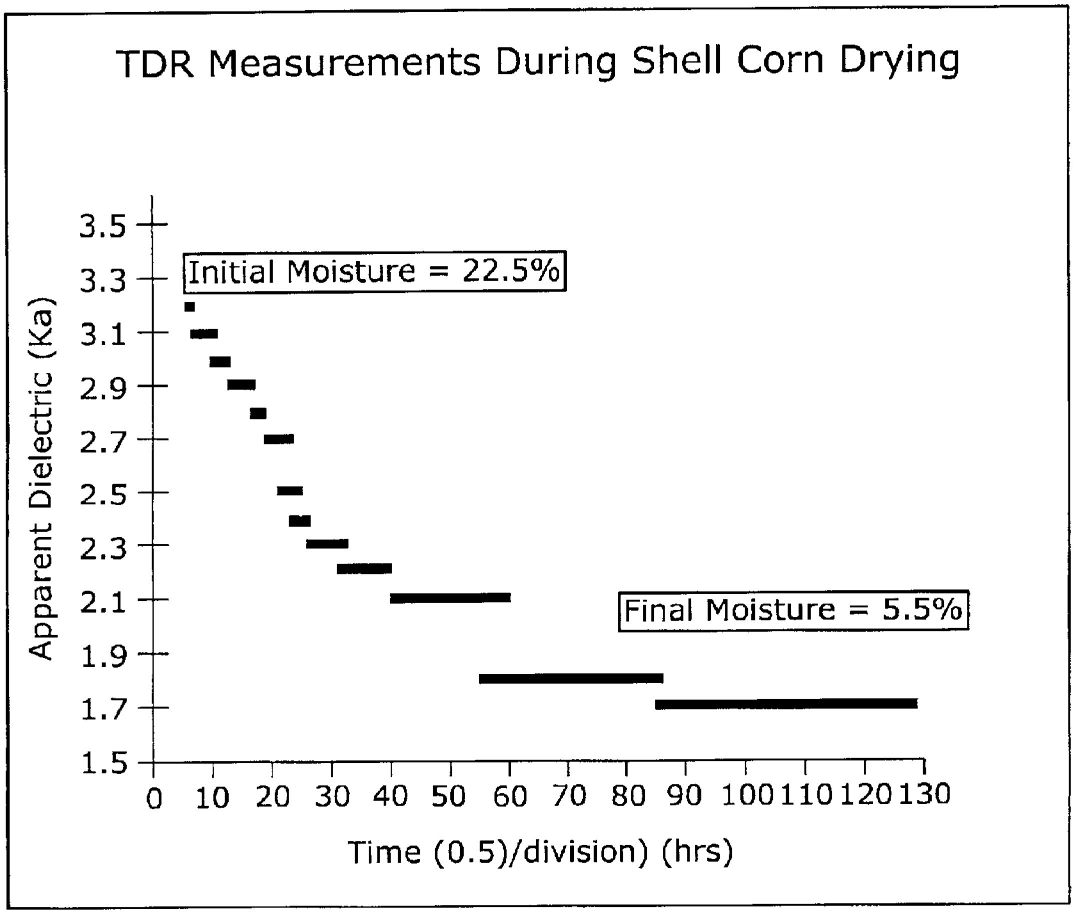
FIG. 5 is a graph showing the correlation of apparent dielectric values of shelled corn over time, relating Δt measurements of the type in the experiment of FIGS. 4A and B at various times in a drying process to apparent dielectric values.

FIG. 5 illustrates a graph of apparent dielectric constant (Ka) versus time during the complete drying process discussed with respect to FIGS. 4A and B. The initial moisture content was known to be 22.5%. Final moisture content was known to be 5.5%. It can be seen how the apparent dielectric constant of the shelled corn decreases as moisture is removed from the corn over time, here about 130 hours.

Figure 6:
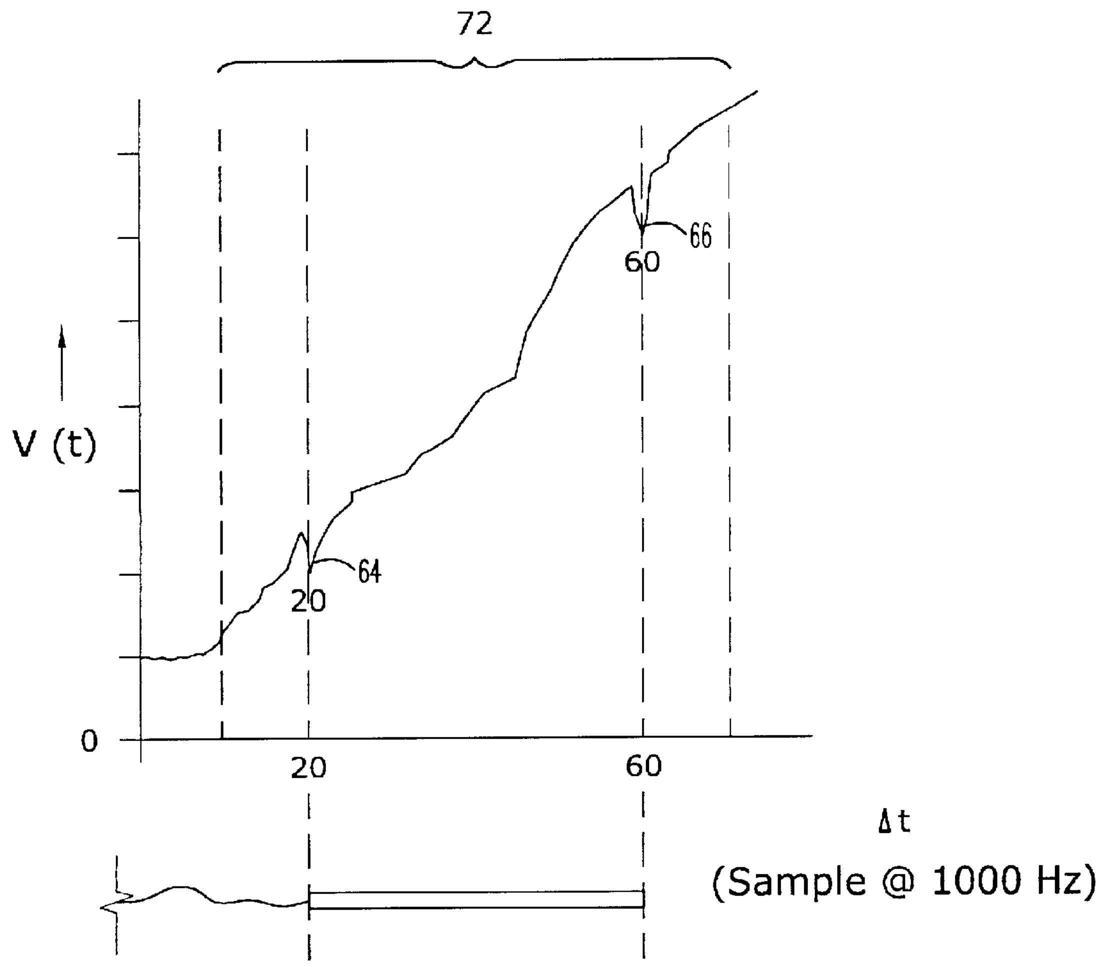
FIG. 6 is an illustration of the relationship between discernable points in the TDR reflection signal and their correlation to physical locations on the TDR probe.

FIG. 6 is a diagrammatic illustration of how the reflected waveform 62 and points 64 and 66 correspond with the physical structure of probe 32, and how a window 72 can be configured to focus upon the relevant part of the waveform.

A straightforward empirical calibration can be used to correlate measured Δt's or Ka to moisture content of the product being monitored. One way to perform such a calibration is as follows.

Procedure:

The calibration is for apparent dielectric constant versus the gravimetric water content calculated on a fresh weight basis. The general steps are:

1. Collect a sample of ears from a bin (large volume typically 100 square feet in cross section or more) reaching as deeply into the pile of ears as possible (typically less than two feet from the surface) at least four places to produce a collection of ears (at least 10).
2. Record the date and time the sample was collected and determine the apparent dielectric constant at that point and store the value.
3. Remove a row of seeds from the ears using a sharpened screw driver or similar device. Remove a couple of adjacent rows. Combine the seed removed from each of the ears collected in step 1.
4. Weigh the seed samples to the nearest $1/1000^{th}$ of a gram.
5. Place the seed in a oven at 105° C. for 72 hours.
6. Weigh the seed sample to the nearest $1/1000^{th}$ gram
7. Calculate the % seed moisture on a fresh weight basis.
   % Fresh weight=(weight of sample initially−weight of dry sample)/weight of fresh sample.
8. Collect samples at a regular interval (every 12 to 24 hours) and determine the moisture.

Regress the apparent dielectric constant versus seed moisture to produce a calibration function.

The TDR system of FIG. 1 is operated to obtain Δt measurements from a probe 32 at pre-selected points in time (e.g. every ½ hour) during a conventional artificial drying of corn in bin 10.

The moisture content of samples would be recorded, along with the Δt for that point in time, for example, in a database such as illustrated in FIG. 7. At each ½ hour check point over the several days of drying, the database would record such things as (a) measurement number ("#"), (b) bin identification ("Tag"), (c) percent moisture (from manually removed and tested samples) ("% M"), (d) "Ka" (from TDR measurements, which are related to Δt), (e) probe (waveguide) identification, (f) channel used on multiplexer, (g) "Δt", (h) "date", (i) time (hour/minute/second). See columns in FIG. 7. Having actual moisture content and Δt for each ½ hour check point, allows one to correlate Ka to moisture content. Thus, one has a straight forward relationship between Ka over a drying period with percent moisture content over that same period. This relationship appears most times to be basically linear in nature.

It should be noted that ideally, the percent moisture content should be of the seed on the ear corn, and not of the ear corn (seed plus carrier, the cob). It is known that approximately 80% of the moisture in ear corn is in the seed. Thus, because of the generally linear relationship between the amount of moisture in the seed and the amount of moisture in the cob, the approximately 20% moisture content of the cobs is either disregarded or compensated for in the calibration. Thus, the calibration results in a function that describes the relationship between Δt and percent moisture content of the seed in the ear corn.

Figure 9A:
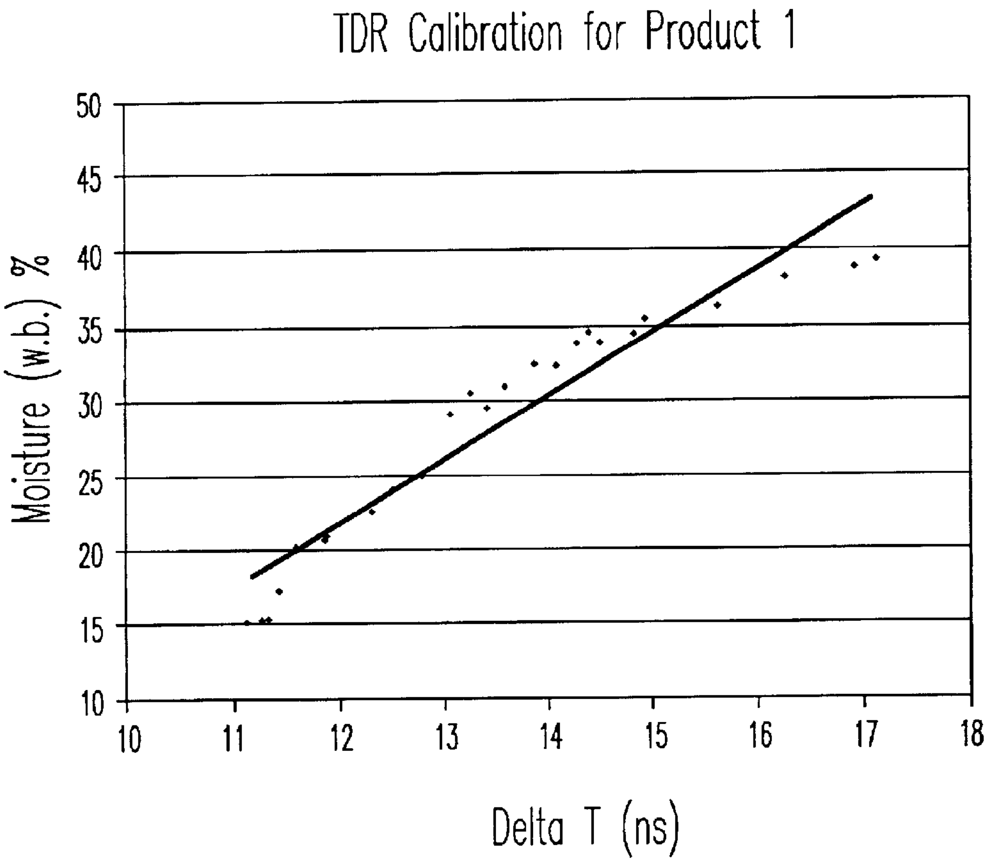
FIG. 9A is a calibration curve showing the correlation between Δt measurements such as shown in FIG. 8 and percent moisture of material being measured.
Figure 9B:
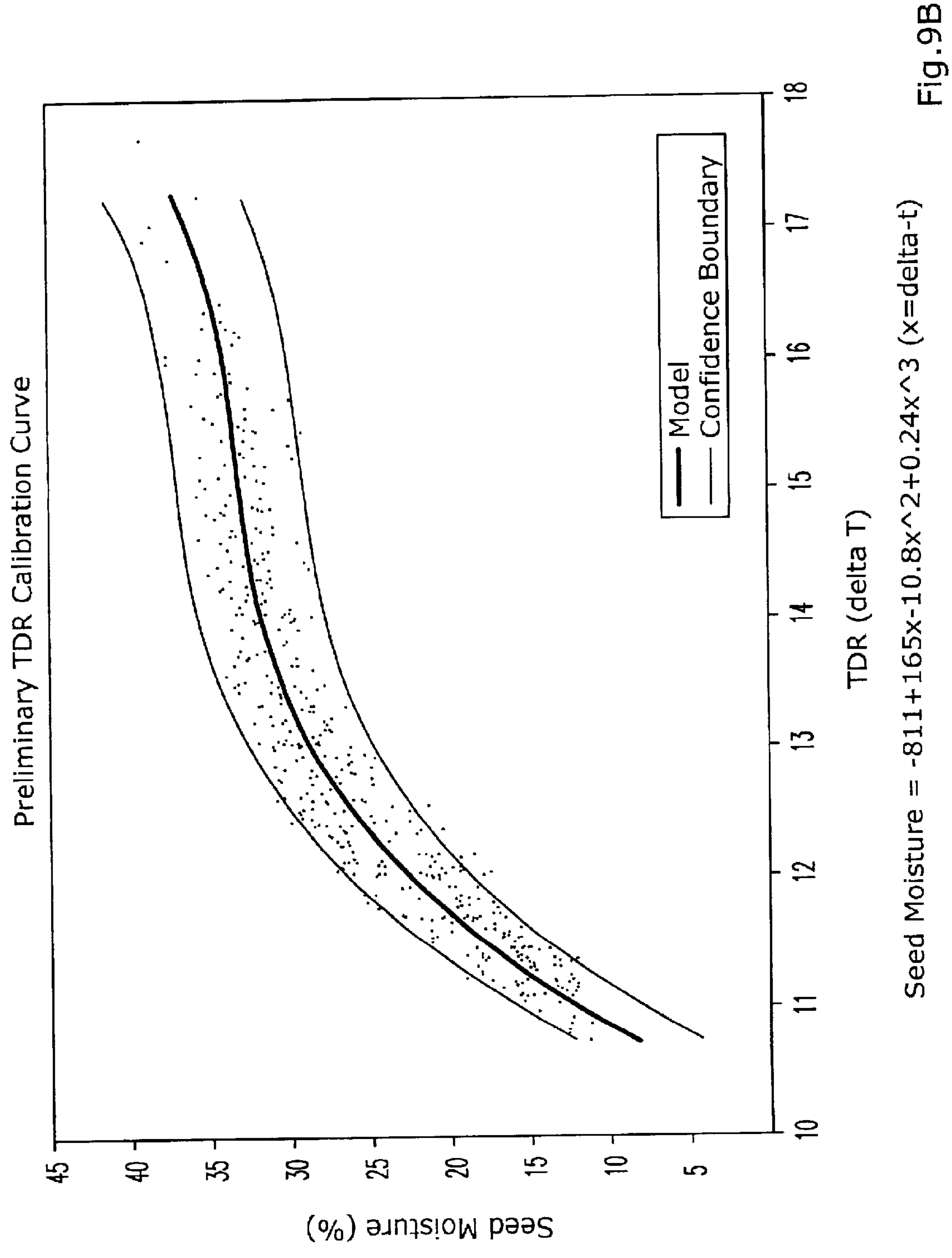
FIG. 9B is another example of a calibration curve.

FIGS. 9A and 9B show exemplary plots of this relationship, including its generally linear nature. The calibration function can be programmed into TDR device 40 or PC 42. These Figures show that once Δt's have been obtained for some events, and the moisture content has been measured by other reliable means, the Δt's can be correlated to moisture content.

As can be understood, different calibration curves will result from different situations. For example, such things as the type of material, probe length, or even different species of the same material may affect the curves. Other factors with seed corn may include pollination, genotype, and/or kernel or ear filling in the drying chamber.

Exact calibration is not necessarily required. A somewhat generalized calibration can be used for most seed corn, for example, and still represent an improvement on the state of the art. It is believed that even a somewhat generalized calibration curve for seed corn will result in accuracy generally on the same level as human operators of drying systems, but also removes the resources drain and safety risks associated with the state of the art methods; e.g. human error, manual removal of ears periodically and lab testing for moisture.

In its simplest form, the calibration comprises using an off-the-shelf TDR device, such as the Soil Moisture Corporation Model BE identified previously, and obtaining Δt measurements for ear corn of known moisture levels over the range of normal moisture levels in ear corn. From this, a calibration data set or curve (see, e.g., FIG. 9) can be created which correlates percent moisture content with the Δt's. This data set or curve can be stored in the TDR device as a look-up table, for example. The Δt's for an unknown moisture content ear corn being measured with the same TDR probe and device can then be compared to the look up table to derive moisture content of that ear corn.

Trase Operating Instructions guide the user how to enter a "Calibration". A moisture vs. TDR transit times table has been established empirically for a number of corn seed, cob varieties by measurement both of TDR times and gravimetric weight moisture content. This collected data can be entered in tabular form into the Trase for internal moisture determination or used by the PC where Trase provides TDR travel times only.

Other calibration methods could, of course, be used. Calibration is normally conducted with the same or similar agricultural product as that to be automatically monitored. For example, an ear corn similar to the ear corn to be measured could be used in the calibration, and that calibration programmed in and used for a variety of similar ear corn, or even all ear corn. It is to be understood, however, that different calibrations could be made for different genotypes of corn or for other differences. For example, different calibrations could be made for corn coming out of different geographic locations, different growing seasons, different growing conditions, etc. It has been found, however, that one calibration for similar type of corn is within acceptable accuracy (covers as high as 90% of variability between ear corn).

3. EXAMPLE 3

Another experiment was conducted using a more conventional ear corn dryer bin and probe of the configuration and size illustrated at FIG. 1. Approximately 100K ears of corn were placed in a 20'×10'×10' bin. During operation of the system of FIG. 1, TDR measurements (Δt's) were converted in real time to moisture content of the seed on the ear corn being dried (see, e.g., FIG. 8) by using a calibration function such as described above.

Figure 8:
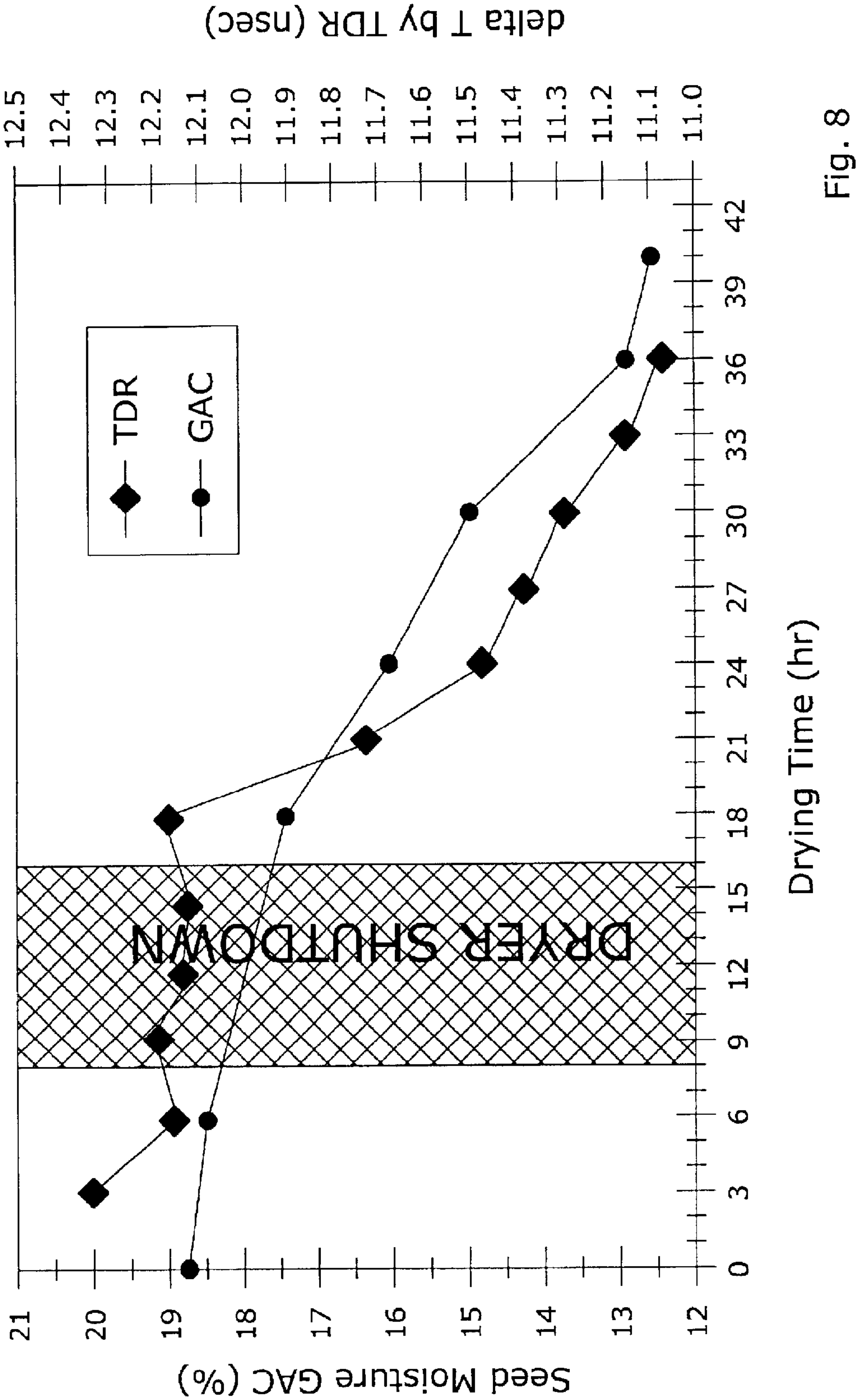
FIG. 8 is a chart illustrating percent moisture relative to drying time relative to Δt measurements, taken by an apparatus according to the invention in ear corn in a conventional dryer bin, and also illustrating the accuracy of TDR moisture monitoring relative to a proven moisture measurement method.

FIG. 8 illustrates essentially data of the type of FIG. 5, but taken from this experiment. During the same drying process, samples were manually removed and moisture measured by a known calibrated moisture content sensor GAC methodology (Grain Analysis Computer, a capacitance based device manufactured by Dickey-John Corporation) such as is known in the art. FIG. 8 shows how changes in TDR Δt during drying correlate relatively closely to seed moisture values.

Interestingly, as indicated in FIG. 8, dryer malfunction occurred between approximately hours 8 and 16. Artificial drying was discontinued during that period. Note how the Δt's remained relatively constant during that time.

D. Operation

Figure 10A:
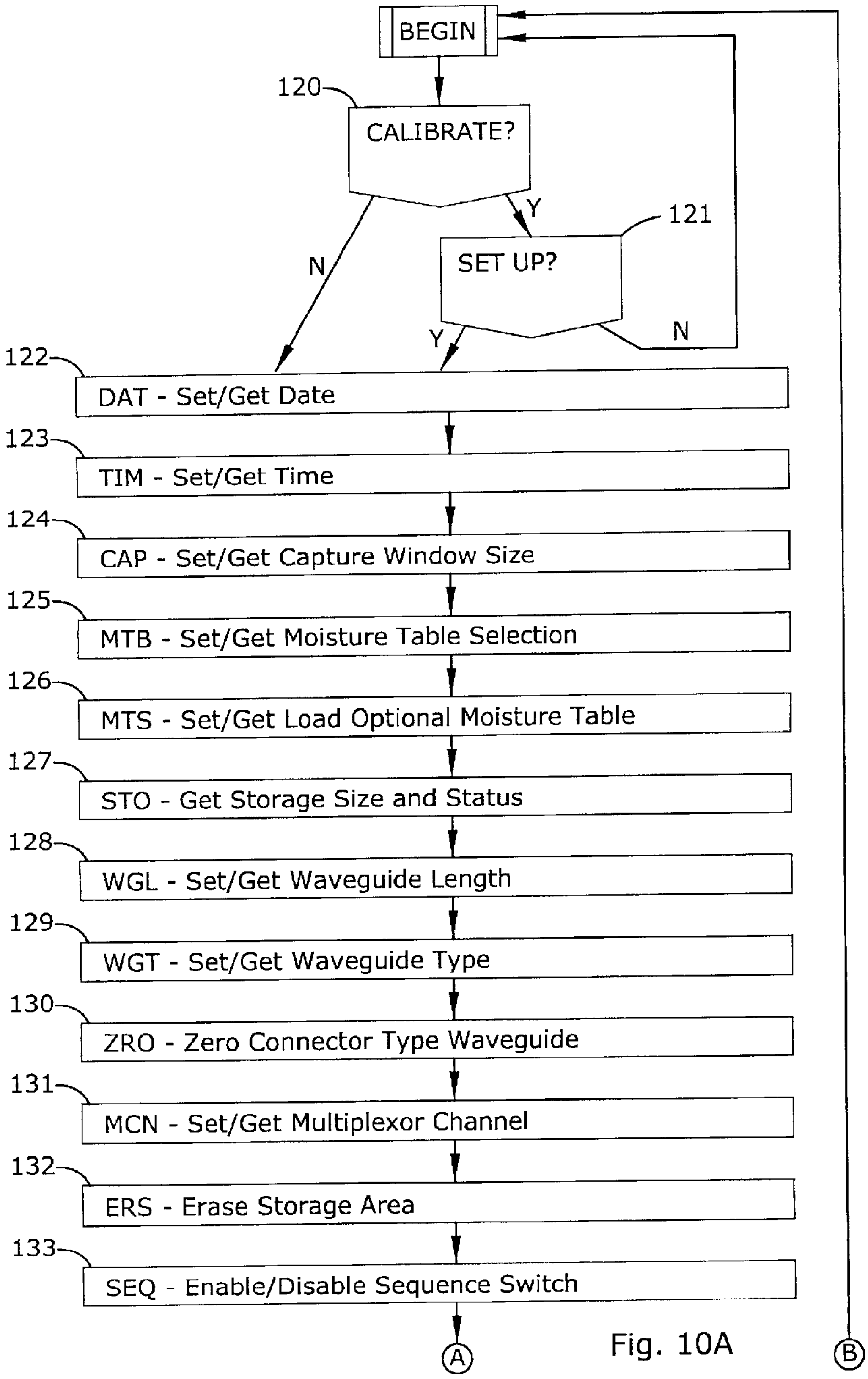
FIGS. 10A and B are flow charts of software that can be utilized with an embodiment of the invention.

By referring to FIGS. 10A and B, operation of an apparatus, system and method such as illustrated at FIG. 1 can be seen. Automatic, real time monitoring of drying in bins 10 is accomplished as follows.

Probe(s) 32 are installed in bin(s) 10 and connected to the electrical components, as described above (see also FIGS. 1 and 3A).

First, calibration (see FIG. 10, step 120) of the system and/or the particular probe 32 to be used of FIG. 1 is conducted, as described previously. A calibration curve for a given product being measured (here ear corn) can be empirically derived as previously discussed. FIG. 9A is one such calibration curve for ear corn shows Δt at sampling times during drying compared to moisture % (w.b.) of manually removed samples by lab method for those same sampling times. Note how the two sets of data are relatively linear. An equation or function can be created to define that relationship, or a look-up table could be stored. Standard linear regression techniques can be used to correlate the two sets of data.

Note also that it is not only important in this example to monitor from time to time how much moisture has been removed, but also drying rate. It is straightforward to calculate drying rate from periodic moisture measurements.

Still further, in this example, it is important to know the end point for drying. For seed corn, it is usually desirable to dry the seed down to approximately 12% moisture content. The present invention can be used to automatically inform when moisture is at about that level. Some type of indicator can be given to the operator to discontinue artificial drying and/or artificial drying can be automatically terminated. The signal can prompt a worker to take some action or could automatically stop artificial drying.

In the instance of FIG. 9A, a Δt value of 10½ to 11½ could be used as the automatic end of artificial drying value, giving a range of Δt values matching up to approximately 12% moisture content of the seed.

The software written in the language used for the BE model has the following characteristics.

It has a strict command/response protocol. Commands are sent from PC 42 to TDR device 40, and TDR device 40 sends responses to PC 42. A character set is used. Communication between PC 42 and TDR device 40 uses only ASCII printable characters. Command and response formats are used. The response parameters depend on the command.

Before commands can be sent to TDR device 40, there must first be a "connect". After sending the last command a "disconnect" can be sent. Sending the connect command, TDR device 40 disables its internal auto-shut-down timer.

After calibration, an initialization or set-up procedure is then followed. See FIG. 10, steps 121–134.

Setup Commands (121)—Setup commands set setup values in TDR device 40. The response from TDR device 40 is the new setup value. These commands can also be used to retrieve setup values. Sending a setup command with no parameters will return the corresponding setup value without modifying it.

DAT—Set/Get Date (122)—The date is a two digit day of the month, a month abbreviation and a two digit year. Valid month abbreviations are: JAN, FEB, MAR, APR, MAY, JUN, JUL, AUG, SEP, OCT, NOV and DEC.

TIM—Set/Get Time (123)—The time is a two digit hour, a two digit minute and a two digit second.

CAP—Set/Get Capture Window Size (124)—Set the capture window size in nanoseconds. The response is the capture window size in nanoseconds. This is the previously discussed window (see, e.g., FIG. 6).

MTB—Set/Get Moisture Table Selection (125)—This command selects the user defined moisture table used by TDR device 40 to convert Ka to percent moisture. The table select code is a three character mnemonic. The table can be generated from the previously described calibration procedure.

MTS—Load Optional Moisture Table (126)—This command loads one of the user defined moisture tables (or calibration data sets or curves) in TDR device 40. TDR device 40 can use one of the these tables to convert Ka to percent moisture.

STO—Get Storage Size and Status (127)—This command returns information about a storage area in TDR device 40. In the command, n is the storage area about which information is requested.

WGL—Set/Get Waveguide Length (128)—Set the waveguide length. The waveguide length is in centimeters. The response is the waveguide length in centimeters.

WGT—Set/Get Waveguide Type (129)—Set the waveguide to be used by TDR device 40.

ZRO—Zero Connector Type Waveguide (130)—Set the TDR device 40 connector zero.

MCN—Set/Get Multiplexer Channel (131)—This command sets the multiplexer channel TDR device 40 will use for future measurements.

ERS—Erase Storage Area (132)—Erase all the readings and graphs in a TDR device 40 storage area. The storage area n, is 1, 2, 3 or 4.

SEQ—Enable/Disable Sequence Switch (133)—This command enables or disables the sequences switch that is activated at the end of an autolog cycle. The command parameter nn is the number of seconds the switch will remain activated. Set this parameter to 0 disables the switch, in other words it will not activate.

VER—Get Firmware Part Number and Revision (134)—This command gets the firmware part number and revision. In the response, the letter at the end of the part number is the revision.

The collection and use of moisture monitoring data can then commence as follows (see FIG. 10, steps 135–139):

Reading and Measurement Commands—

MES—Measure Moisture (136)—Each time TDR device 40 makes a measurement it stores the reading and graph in a temporary buffer.

GTR—Get Stored Moisture Reading (137)—Get a stored graph from TDR device 40.

If TDR device 40 used a custom moisture table to make the measurement, the contents of this table are appended to the graph data in the response.

STR—Store Current Reading (138)—Store the most recent reading in a TDR device 40 storage area.

TAG—Set/Get Reading Tag (139)—Set the tag text to be stored with readings. This text is stored as part of the reading information.

Figure 10B:
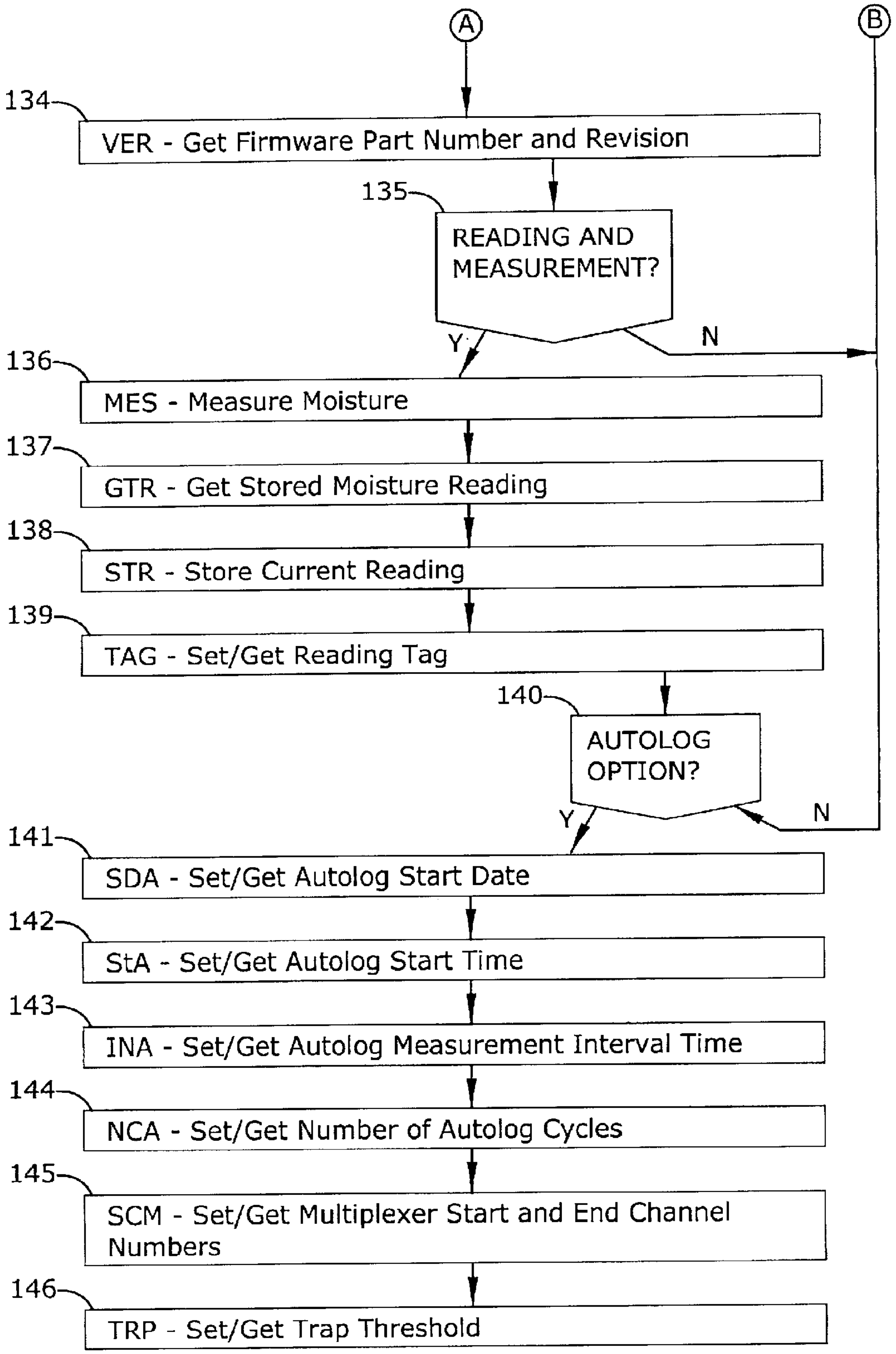

There are also what are called "autolog" functions as follows (FIG. 10, steps 140–145). These could also be accomplished in PC 42:

Autolog Commands

SDA—Set/Get Autolog Start Date (140)—Set the autolog start date. This is the date on which the next autolog cycle will start.

STA—Set/Get Autolog Start Time (141)—Set the autolog start time. This is the time at which the next autolog cycle will start.

INA—Set/Get Autolog Measurement Interval Time (142)—Set the autolog measurement interval in hours and minutes.

NCA—Set/Get Number of Autolog Cycles (143).

SCM—Set/Get Multiplexor Start and End Channel Numbers (144)—Set the starting and ending multiplexer channel numbers. The command parameters are:

TRP—Set/Get Trap Threshold (145)—Set the autolog reading trap value.

Error codes can be used as follows:

Error Codes—Most responses include a three digit error code. The most significant digit contains general status information.

Thus the software enables the method of monitoring drying by controlling interface 38 to multiplex the step function pulses to each set of members 33A–C in each bin 10 filled with ear corn 16 (here up to 24 bins so need 96 channels). Interface 38 would receive the reflections of the step pulses through cable 34 and sends those reflections to device 40 for evaluation. That information could be used by PC 42 which would keep track of the moisture readings for the locations of probe 32A–D and bin 10 over time. Software programming in PC 42 would compare the moisture readings and instruct airflow/temperature controller 30 regarding how much airflow and at what temperature should be introduced into bin 10 to maintain drying at the desired rate of moisture removal. As previously discussed, control over moisture removal rate while processing ear corn can significantly affect quality of seed corn taken from the ear corn for use by farmers.

Software causes device 40 to measure Δt (as explained above) for each sample time for each probe 32A–C and derive moisture content for the ear corn 16 surrounding each probe 32A–C. Device 40 sends Δt values from Soil Moisture BE model TDR evaluator via a serial port to PC 42. An algorithm in PC 42 evaluates the Δt's regarding the reflections related to the ends of members 33A–33C. As the ear corn dries, the EM propagation speeds increase and therefore the Δt's shorten. PC 42 takes the Δt's, calculates drying rate, and can alert the operator of the condition or send instruction to air/temperature controller 30.

Thus, the apparatus, system and method described here provides non-destructive, automatic and autonomous moisture content measurement in continuous real time. There are no moving parts and it does not involve safety hazards associated with some other non-destructive moisture measurement methods. There is minimal disruption and occupation of the dryer interior or product during loading, unloading, and drying. Measurements can be taken from the interior of the product being dried. It also is self-cleaning and flexible with respect to set-up and configuration.

The calibration requirements are not substantial or complicated and it has been found to have excellent spatial and temporal resolution.

Autolog is a term to refer to the automated measurement in an unattended manner. One would set the start time and date, time between measurements and the number of cycles to be measured. Trase will then measure as specified in the "Autolog" state. This was developed for remote applications where communications with Trase are at a premium (radios, cell phones etc.). Use of PC 42 with direct connection to the Trase can eliminate the need to use Autolog features in general.

E. Extension To Dryer Control

As previously mentioned, incorporated-by-reference U.S. Pat. No. 5,893,218 discloses and describes an automatic drying system for ear corn. A PC-based system measures such parameters as air pressure, temperature, and perhaps other factors in bin 10 and feeds that information to PC 42. PC 42 then can control gates to precisely control airflow and air temperature.

By being able to provide real-time moisture information for PC 42, a drying system that would essentially be totally automated, could be created. It is known or could be directly dictated what amount of moisture should be removed per period of time to artificially dry seed corn, as well as the end point or lowest moisture level for the product being dried. PC 42 could be programmed to take the continuous moisture readings for ear corn 16 in bin 10 and compare it to the desired moisture removal rate. If drying is preceding too fast or too slow, PC 42 could instruct airflow/temperature controller 30 to in turn adjust air flow and/or temperature to bring drying process back in line using actuators and sensors, for example, actuators to control louvers and gates, and sensors to monitor air temperature and pressure, all as illustrated in FIG. 1 and as described in U.S. Pat. No. 5,893,218, incorporated by reference herein. PC 42 can also terminate artificial drying upon reaching the end point moisture level.

Drying rate can be measured directly and on a continuous basis. Drying can be controlled by actual moisture measurements, not predictions. This provides for a system that promotes good seed quality from the drying process as well as the added benefit of efficiency in dryer use, which impacts energy usage and costs, as well as equipment usage.

It should be noted that it can be important to monitor both drying temperature and drying rate. The temperature is easily monitored by use of thermocouples or other temperature sensors. The drying rate is determined by moisture samples manually collected, as previously described.

At the end of the process, a database similar to that of FIG. 7 could be created by TDR device 40 and/or PC 42. Such a table of data derived from a drying process, including monitoring of moisture by TDR, could be stored for future reference or as documentation showing how TDR effectively measures moisture removal over time.

F. Options, Features, and Alternatives

The included preferred embodiment is given by way of example only and not by way of limitation to invention which is solely described by the claims herein. Variations obvious to one skilled in the art will be included in the invention defined by the claims.

For example, the preferred embodiment discusses drying of ear corn. Other applications are possible. Other porous media might include grass clippings, wood chips, shelled corn, dog food, bales of hay, sunflower seed, pelletized alfalfa and the like. It is to be understood, as has been described previously, moisture content can be monitored whether or not the porous media is singulated or attached to a carrier, e.g. seed corn moisture can be monitored while it is attached to its carrier, the corn cob.

It has been found that TDR is fairly independent of porous media being tested. In other words, although some calibration is required, it is not unduly burdensome or different from product to product. It is possible to have several probes 32, at different positions in the bin. Calibration may be genotype specific, but might be accurate enough even if not. Calibration can be across a range of genotypes and physical conditions of the product. For example, moisture content may vary across well-pollinated ears of corn versus poorly pollinated, but not enough to require different calibrations. Accuracies have been obtained in the range of +/−3% or better. This is better than known technologies, especially in situ moisture measurement techniques or predictions. Although there is not a known way to completely generalize a calibration for all materials, there could be an “online” observation of Δt at the beginning of drying for a bin to establish a conversion between TDR and drying rate for that bin.

As previously mentioned, spacing from structure such as the floor seems to have an effect. The probe must not be too low or too high relative the floor of the bin. In the preferred embodiment, approximately one to two feet from the bin floor seems to work well. Alternatively, it may be possible to make the floor a part of the circuit for the probe.

FIGS. 11A–F illustrate an example of an alternative specific probe 32 that could be used to monitor moisture in an ear corn dryer bin such as shown in FIG. 1. An array 100 (approximately 100" tall by 100" wide by 3" thick) of probe members 103A–I (aluminum tube 2" diameter by 1¼" wall by 8 foot long), can be installed in the center of a dryer bin such as shown in FIG. 1). Members 103 here are parallel to floor 12 (see FIG. 1). A plurality of individual conductors, here members or tubes 103, are supported at opposite ends on vertical pieces 104 (approximately 96" long) that can be installed to the perforated floor of the bottom of bin and to an approximately 20 feet long, 2" by 2" by ¼" tubular member 106 that extends between and is attached to opposite side walls of the bin. Array 100 thus would be robust, supported inside bin 10. Packing would occur all around it. Wiring to probe 100 would be through the interior of the supports, so that it would not be exposed to the ear corn.

FIGS. 11B–F show details of the connection of tubes 103 to the vertical members 104. BNC connectors 186 are operatively mounted at probe members 103B, 103D, 103F, and 103H. Probe members 103A and 103C correspond to probe members 103B; 103C and 103E for probe members 103D; 103E and 103G for 103F; and 103G and 103I for 103H. Sequential monitoring of moisture from various strata in the same bin 10 is thus possible.

Figures 11A, 11B, 11C:
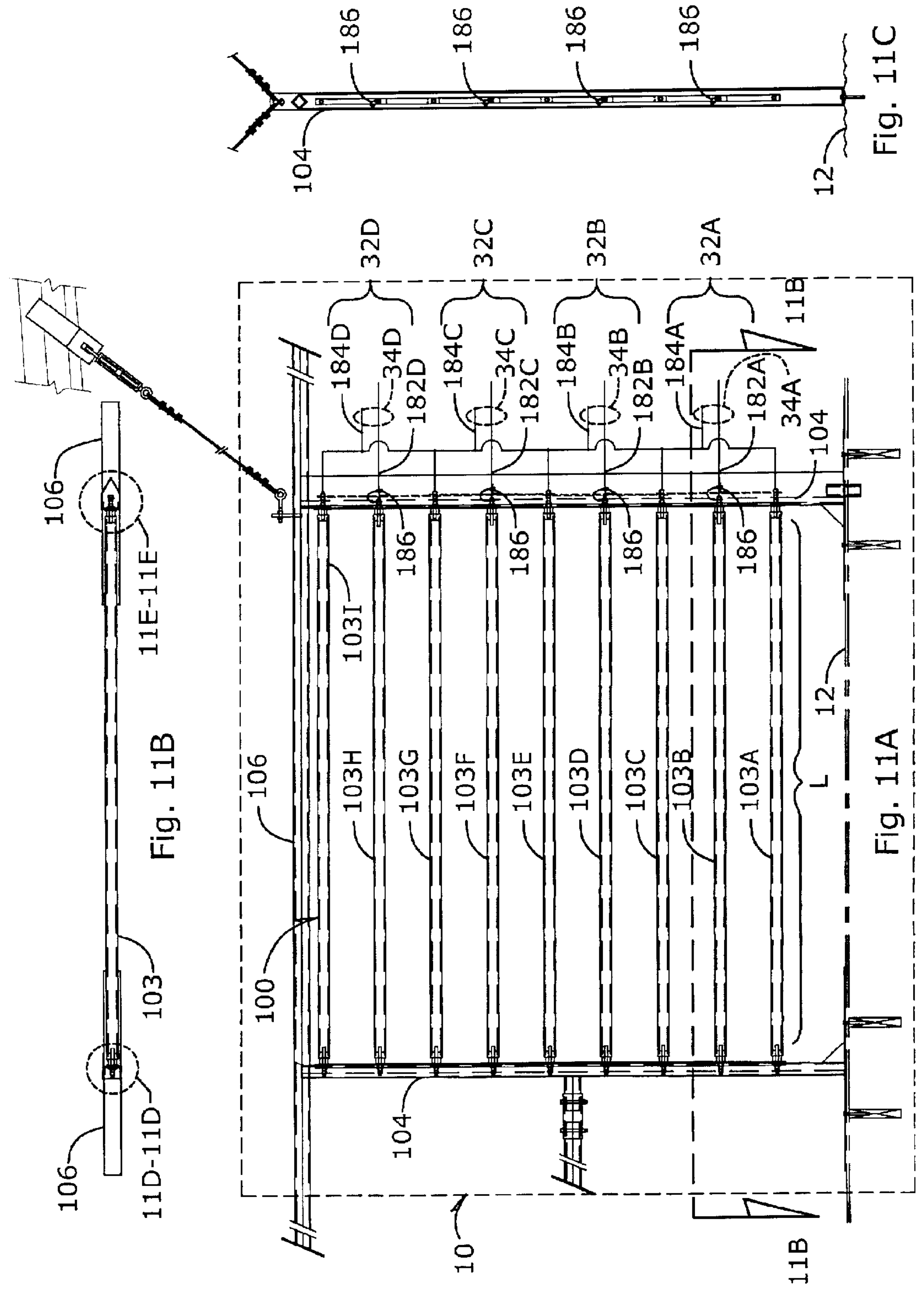
FIGS. 11A–F illustrate an alternative embodiment of a probe that can be used with the invention for measuring moisture in ear corn in a large bin.
Figure 11D:
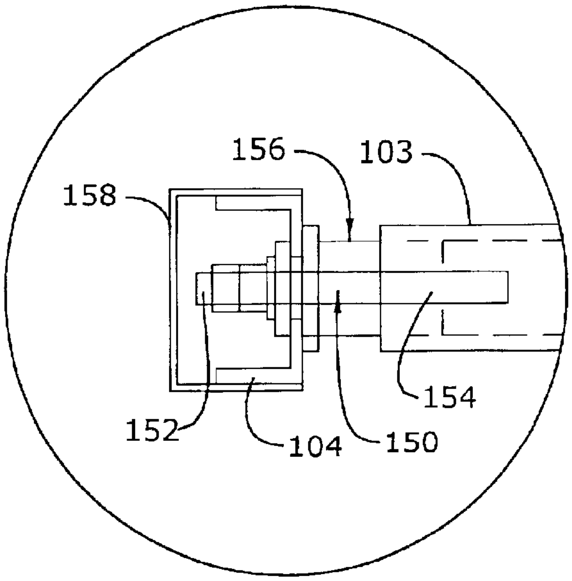

FIG. 11D illustrates the connection of the far ends of probe members 103 in a frame. Those ends are electrically isolated from each other by using an electrically insulating member 156 between member 150 and support 104. Insulating member 156 can seat into an opening in support 104. An electrically conductive pin or member 150 has one end conductively connected to member 150 and extends outwardly from the end of member 150 through insulating member 156 to an exposed end 152 in the interior of support 104. Pin end 152 can be threaded and receive threaded nuts to lock the combination together to hold the end of member 150 shown in FIG. 11D rigid, yet it is electrically isolated from support 104.

Figure 11E:
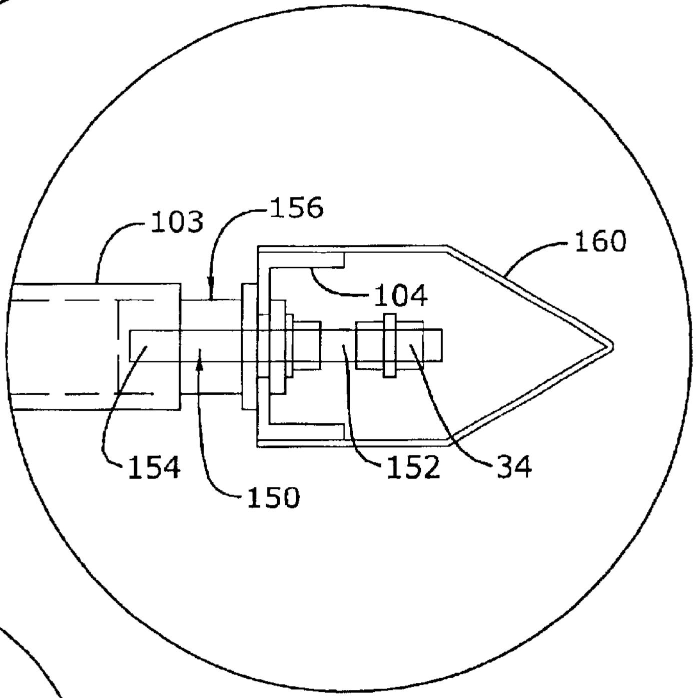

FIG. 11E illustrates the connection of the near ends of probe members 103 in the frame. Those ends are electrically isolated from each other by in a similar manner as described above except that conductor 34 can be conductively connected to the distal end 152 of pin 150. Note that removable covers 158 and 160 can be placed over the open outward facing sides of supports 104 to cover and isolate ends 152 of pins 150, but provide easy access to them. Vertical distance between tubes 103 can be approximately 10" on center.

Figure 11F:
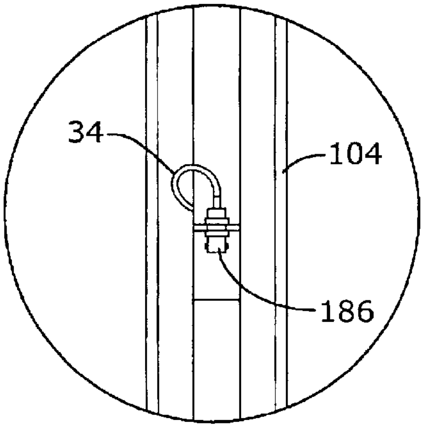

FIG. 11F illustrates connection of cable 34 to tube 103. FIG. 11F is shown with cover 160 removed. Wiring is thus protected inside the supports.

The configuration of array 100 is robust and strong to take the forces of thousands of pounds of ear corn. It is self-cleaning in the sense that ears or seeds do not get hung-up on members 103 so that there is no carry over of seeds from one drying batch to a succeeding batch. There is minimal or no interference with the drying process.

Another feature of the invention is that it could be easily retrofitted into existing dryers. Probes 32 are relatively small in volume consumed inside bin 10 compared to the overall drying volume of the dryer bin, and with such things as a header 36, can be structurally rigidly attached to or supported in association with a dryer bin 10. They could also be built as original equipment into a drying system.

Furthermore, it is to be understood that the present invention can be used to monitor moisture in a plurality of dryer bins. A probe 32 could be placed in each bin and TDR information from each bin can be transduced and used to monitor and/or control the drying process independently in each bin.

It may be possible to use the invention in bulk storage situations. A probe can be positioned in the stored material and provide moisture readings. It can be positioned prior to loading of the material around it. Alternatively, the probe might be configured to be insertable into a mass of material.

Figure 12:
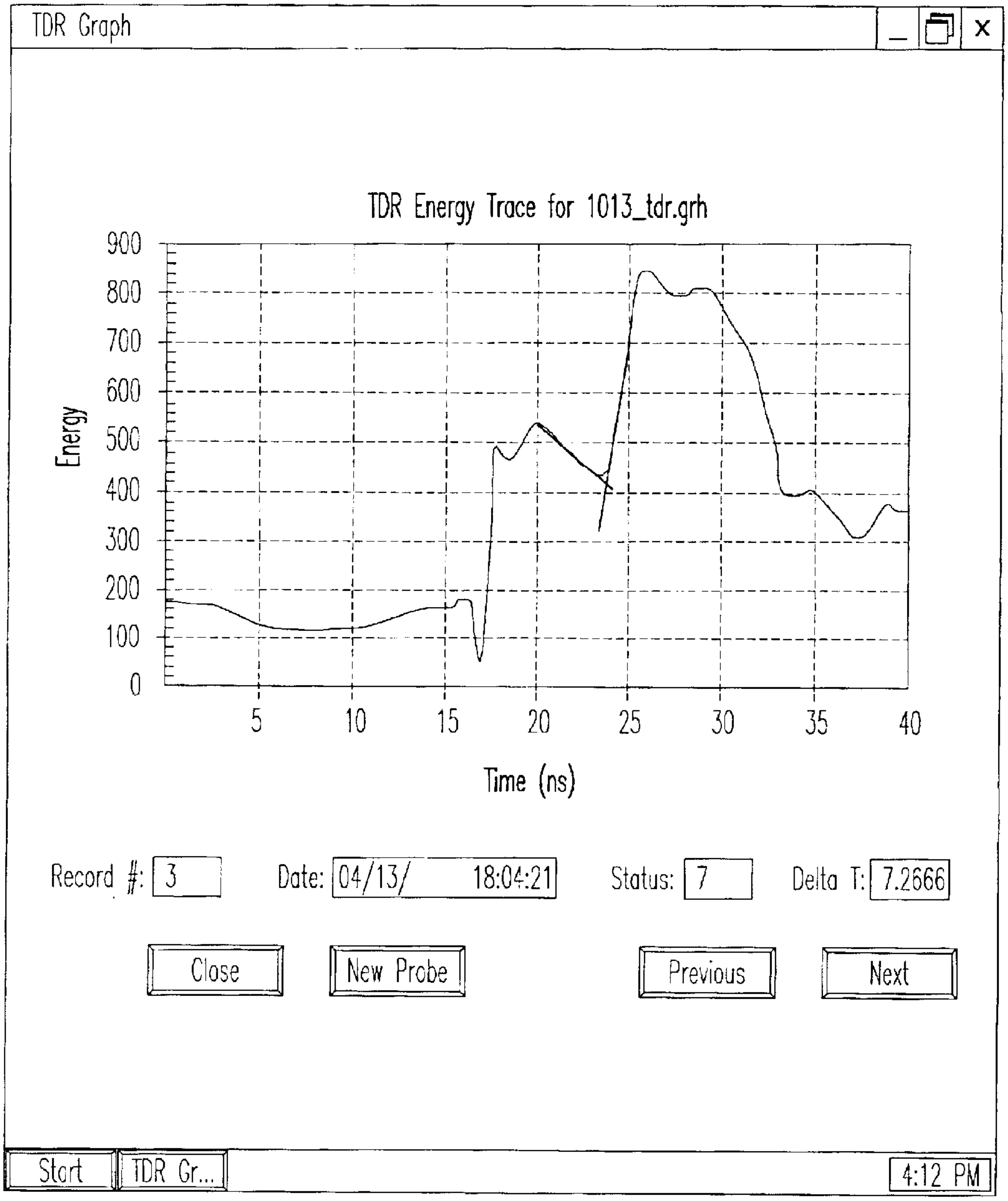
FIG. 12 is an example of a graphic user interface for a PC according to an embodiment of the invention.

FIG. 12 illustrates an example of a graphic user interface (GUI) that could be used. FIG. 12 illustrates a graph of a Δt during a drying process. The beginning and end of the probe can be clearly seen. The GUI shows the calculated Δt (7.266) and the date and time of the sample. Other GUI's can be created to illustrate other aspects or functions of the software.

What is claimed:

1. A method of monitoring drying of a relatively large volume batch of an agricultural porous media wherein the porous media is selected from the set comprising grain and seed, whether or not separated from a carrier or other vegetative structure, comprising:

(a) deriving a moisture content in the batch of the porous media by time domain reflectometry;

(b) utilizing the value to monitor drying of the porous media and in control of artificial drying process of the batch.

2. The method of claim 1 further comprising monitoring drying rate of the media.

3. The method of claim 1 further comprising monitoring moisture content of the media and comparing moisture content to an end point moisture content.

4. The method of claim 3 further comprising generating a signal when the end point moisture content is reached.

5. The method of claim 1 wherein the porous media is seed.

6. The method of claim 5 wherein the seed is sunflower seed.

7. The method of claim 5 wherein the seed is corn.

8. The method of claim 7 wherein the corn is ear corn.

9. The method of claim 7 wherein the corn is shelled corn.

10. The method of claim 1 further comprising deriving moisture content at a plurality of locations in the porous media.

11. The method of claim 10 wherein the plurality of locations are at different vertical heights.

12. The method of claim 10 further comprising utilizing the derived moisture contents to control an artificial drying process.

13. The method of claim 1 wherein the step of deriving moisture content comprising obtaining a TDR measurement via a probe at least substantially surrounded by the porous media and comparing the TDR measurement to a calibration data set.

14. The method of claim 1 further comprising positioning an electrically conducting probe of a length L in the bin so that the porous media at least substantially surrounds the probe; creating an impedance mismatch at the point of electrical connection of the probe to a cable; sending a step function voltage pulse through the cable, the impedance mismatch, and the probe; measuring the reflection of the pulse.

15. The method of claim 14 wherein the step function is a non-shorted step pulse.

16. The method of claim 14 wherein the pulse is generated and communicated to each probe.

17. The method of claim 14 wherein the impedance mismatch is ideal.

18. The method of claim 14 wherein the impedance mismatch is created by operatively placing a capacitor in the path of pulse.

19. The method of claim 14 wherein the impedance mismatch is created by crimping an electrical conduit for the pulse.

20. The method of claim 1 further comprising measuring moisture content and monitoring drying in a plurality of dryer bins.

21. The method of claim 1 wherein the moisture content is derived at successive times during drying.

22. The method of claim 21 wherein the successive times are spaced intervals of time.

23. The method of claim 1 wherein the moisture content is derived interiorly of the mass or collection of porous media.

24. The method of claim 23 wherein the moisture content is derived across a substantial portion of the porous media.

25. A method for monitoring moisture content of an agricultural product wherein the agricultural product is grain or seed whether or not on a carrier and the moisture content of the grain or seed is derived by compensating for moisture in the carrier, if any, during an artificial drying process comprising:

(a) placing the product to be dried into a relatively large drying bin;

(b) positioning an electrically conducting wave guide of known length in the product;

(c) sending an electromagnetic pulse through the wave guide;

(d) deriving amount of time for said pulse to move end to end through the wave guide by time domain reflectometry;

(e) deriving moisture content of the product around the wave guide from the time domain reflectometry derived time; and (f) utilizing the moisture content derived by time domain reflectometry in control of the driving process.

26. The method of claim 25 further comprising placing a plurality of wave guides of known length into the product.

27. The method of claim 25 wherein the control of the drying process comprises utilizing measured moisture content derived by time domain reflectometry in the control of airflow and/or air temperature through the product.

28. An apparatus for monitoring artificial drying of an agricultural porous media wherein the agricultural product is grain or seed, whether or not on a carrier and the moisture content of the grain or seed is derived by compensating for moisture in the carrier, if any, comprising;

(a) a relatively large drying chamber for holding a porous media to be dried;

(b) a time domain reflectometry wave guide adapted for insertion into a porous media in the drying chamber;

(c) a time domain reflectometry device;

(d) the wave guide and the time domain reflectometry device adapted for electrical communication;

(e) the time domain reflectometry device adapted to derive moisture content of the porous media from time domain reflectometry signals which travel through the wave guide, and make derived moisture content available for use in monitoring or controlling the drying process;

(f) a dryer controller operatively connected to the time domain reflectometry device.

29. The apparatus of claim 28 wherein the porous media comprises ear corn.

30. The apparatus of claim 29 wherein the drying chamber is a bin at least several feet by several feet in size.

31. The apparatus of claim 28 wherein the wave guide comprises an electrically conducting rod of a certain length.

32. The apparatus of claim 31 wherein the wave guide comprises an array of electrically conducting rods spaced apart from one another and connected to a header.

33. The apparatus of claim 28 wherein the TDR device comprises a step voltage pulse generator and digital sampler, the step voltage generator connected by an electrical cable to the electrical connection, the digital sampler electrically connected to the electrical connection.

34. The apparatus of claim 28 further comprising a dryer controller operatively connected to the time domain reflectometry device, the dryer controller including a processor adapted to receive a signal from the TDR device and utilize it to generate instructions adapted for a drying system for controlling airflow and/or temperature to the bin.

35. The apparatus of claim 34 further comprising an interface between the wave guide and the TDR device, the interface comprising a multiplexer.

36. The apparatus of claim 28 further comprising a component to introduce an impedance mismatch prior to the wave guide.

37. The apparatus of claim 36 wherein the component to introduce an impedance mismatch comprises a capacitor.

38. The apparatus of claim 36 wherein the component to introduce an impedance mismatch is created by placing a crimp in the electrical connection at or very near its connection to the wave guide.

39. An apparatus to monitor moisture content of an agricultural product wherein the agricultural product is grain or seed, whether or not on a carrier, and the moisture content of the grain or seed is derived by compensating for moisture in the carrier, if any, to assist in control of artificial drying of the product comprising:

(a) a dryer bin adapted to hold a relatively large amount of agricultural product;

(b) a TDR probe positioned in the bin;

(c) an electromagnetic energy source adapted to create an electromagnetic pulse to travel through the probe;

(d) an electromagnetic reflection sensor;

(e) an electrical interface between the probe and the energy source and the reflection sensor;

(f) an electromagnetic reflection analyzer electrically interfaced with the electromagnetic reflection sensor;

(g) so that time domain reflectometry information can be derived for the pulse relative to the probe (h) a connection between the processor and a dryer controller so that artificial drying can be controlled by instructing the dryer controller as a function of moisture content readings.

40. The apparatus of claim 39 wherein the probe comprises an elongated electrically conducting wave guide.

41. The apparatus of claim 40 further comprising a plurality of probes.

42. The apparatus of claim 39 wherein the electromagnetic energy source is a step voltage generator.

43. The apparatus of claim 39 wherein the electromagnetic reflection sensor is a digital sampler.

44. The apparatus of claim 39 wherein the electrical interface comprises a multiplexer.

45. The apparatus of claim 39 wherein the electromagnetic reflection analyzer is a processor.

46. The apparatus of claim 45 wherein the processor includes software for evaluating the output of the reflection sensor and deriving moisture content of the product surrounding each probe related to a point in time.

47. The apparatus of claim 39 further comprising a plurality of probes for a plurality of dryer bins, each probe operatively connected to the electromagnetic source and reflection sensor, for monitoring moisture in a plurality of locations simultaneously or sequentially.

48. The apparatus of claim 47 further comprising operatively connecting the reflection sensor to a processor having an interface with a control unit for controlling operation of a dryer.

49. The apparatus of claim 48 wherein the probe is in the range of 4 feet to 16 feet long.

50. The apparatus of claim 48 wherein the probe is comprised of tubes approximately 2 inches in diameter.

51. The apparatus of claim 48 wherein the probe extends substantially across the bin.

52. The apparatus of claim 51 further comprising supports to attach and hold the probe relative to the bin.

53. The apparatus of claim 48 wherein the probe comprises three electrically conducting members, generally parallelly spaced apart.

54. The apparatus of claim 53 wherein a middle wave guide element is connected to the electromagnetic energy source and outer wave guide elements to ground.

55. The apparatus of claim 53 further comprising a plurality of wave guide elements, generally parallel to one another, successive wave guide elements alternating between connection to the electromagnetic energy source and ground respectively, except for outer two wave guide elements which are connected to ground.

56. A probe for use with a TDR system for monitoring artificial drying of an agriculture product wherein the agricultural product is grain or seed, whether or not on a carrier, and the moisture content of the grain or seed is derived by compensating for moisture in the carrier, if any, in a dryer bin or chamber of over 50 cubic feet in volume, comprising:

(a) an elongated electrically conductive member sized to extend a substantial distance into a material to be measured in the bin or chamber;

(b) a connection to an electrical conduit adapted for connection to a TDR device;

(c) an impedance mismatch component in the electrical conduit;

(d) a support connection adapted to connect the conductive member to supporting structure associated with the bin or chamber.

57. The apparatus of claim 56 wherein the electrically conductive wave guide elements comprise a waveguide array of three elongated electrically conductive wave guide elements each the same length from 4 feet to 16 feet long adapted to be generally parallelly spaced apart in position in a bin or chamber, the center waveguide element adapted to be in electrical communication with a fast rising stepped electromagnetic pulse via the conduit, the outer wave guide elements adapted to be connected to ground.

58. The apparatus of claim 57 wherein each member is in the range of 4 to 16 feet long.

* * * * *

UNITED STATES PATENT AND TRADEMARK OFFICE

CERTIFICATE OF CORRECTION

PATENT NO. : 6,747,461 B2 — Page 1 of 1
APPLICATION NO. : 10/004066
DATED : June 8, 2004
INVENTOR(S) : Steven J. Corak, James L. Hunter and Whitney Skaling It is certified that error appears in the above-identified patent and that said Letters Patent is hereby corrected as shown below:

Column 26, Line 21 should read:
or seed, whether or not on a carrier and the moisture content Column 26, Line 38 should read:
reflectometry in control of the drying process.

Column 28, Line 53 should read:
conductive wave guide elements comprise a wave guide Column 28, Line 57 should read:
a bin or chamber, the center wave guide element adapted to Signed and Sealed this Fifth Day of September, 2006

JON W. DUDAS
*Director of the United States Patent and Trademark Office*